US012712031B2

(12) United States Patent
Kumano et al.

(10) Patent No.: US 12,712,031 B2
(45) Date of Patent: Aug. 18, 2026

(54) MEMORY SYSTEM

(71) Applicant: Kioxia Corporation, Tokyo (JP)

(72) Inventors: Naoto Kumano, Yokohama (JP); Kenji Sakurada, Yamato (JP)

(73) Assignee: Kioxia Corporation, Tokyo (JP)

( * ) Notice: Subject to any disclaimer, the term of this patent is extended or adjusted under 35 U.S.C. 154(b) by 157 days.

(21) Appl. No.: 18/747,270

(22) Filed: Jun. 18, 2024

(65) Prior Publication Data

US 2024/0428868 A1 Dec. 26, 2024

(30) Foreign Application Priority Data

Jun. 20, 2023 (JP) ................................ 2023-100906

(51) Int. Cl.
*G11C 16/04* (2006.01)
*G11C 16/20* (2006.01)
*G11C 16/34* (2006.01)

(52) U.S. Cl.
CPC ...... *G11C 16/3404* (2013.01); *G11C 16/0483* (2013.01); *G11C 16/20* (2013.01)

(58) Field of Classification Search
CPC . G11C 16/3404; G11C 16/0483; G11C 16/20; G11C 16/26; G11C 16/30; G11C 29/42; G06F 11/1048; G06F 11/1068
USPC .................................................... 365/185.24
See application file for complete search history.

(56) References Cited

U.S. PATENT DOCUMENTS 8,625,347 B2 * 1/2014 Sakurada ............ G11C 11/5642 365/185.03
10,210,042 B2 * 2/2019 Sakurada ............... G06F 3/064
2014/0223263 A1 8/2014 Sakurada
2015/0169401 A1 6/2015 Tseng
2018/0006667 A1 1/2018 Motwani
2018/0074894 A1 3/2018 Sakurada
2022/0180957 A1 6/2022 Yang

FOREIGN PATENT DOCUMENTS

TW I527036 B 3/2016

* cited by examiner

*Primary Examiner* — Tha-O H Bui
(74) *Attorney, Agent, or Firm* — Kim & Stewart LLP

(57) ABSTRACT

A memory system includes a semiconductor memory including a plurality of first memory cells each configured to store data in a non-volatile manner according to a threshold voltage, and a controller. The controller is configured to perform a first error correction process for the plurality of first memory cells, based on first hard bit data and first soft bit data acquired using a plurality of first soft bit voltages that have been calculated based on a shift voltage, and to correct the shift voltage when a condition based on correction data generated during the first error correction process, is satisfied.

20 Claims, 13 Drawing Sheets

| HB2 | 1 | 1 | 1 | 1 | 0 | 0 | 0 | 0 |
|---|---|---|---|---|---|---|---|---|
| SB1 | 1 | 1 | 0 | 0 | 0 | 0 | 1 | 1 |
| SB2 | 1 | 0 | 0 | 1 | 1 | 0 | 0 | 1 |
| index1 | 1 | 2 | 3 | 4 | 5 | 6 | 7 | 8 |

1
MEMORY SYSTEM
10
CONTROLLER
20
MEMORY DEVICE
/CE
CLE
ALE
/WE
/RE
/RB
IO<7:0>
16
ECC CIRCUIT
14
HOST I/F
12
BUILT-IN MEMORY
NAND I/F
15
BUFFER MEMORY
13
PROCESSOR
11
HOST BUS
2
HOST DEVICE

FIG. 4

| HB2 | 1 | 1 | 1 | 1 | 0 | 0 | 0 | 0 |
|---|---|---|---|---|---|---|---|---|
| SB1 | 1 | 1 | 0 | 0 | 0 | 0 | 1 | 1 |
| SB2 | 1 | 0 | 0 | 1 | 1 | 0 | 0 | 1 |
| index1 | 1 | 2 | 3 | 4 | 5 | 6 | 7 | 8 |

FIG. 10

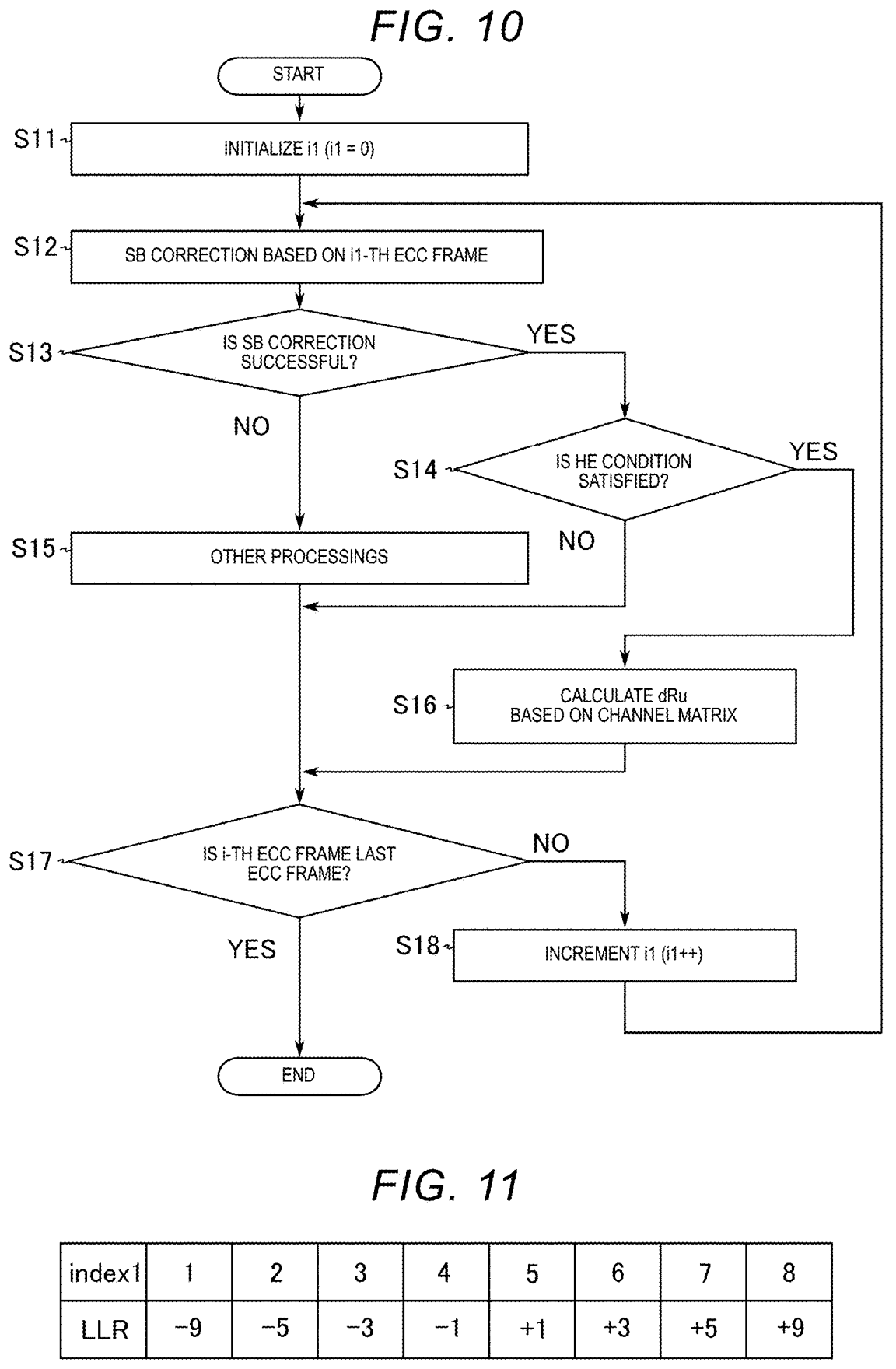

START
S11 INITIALIZE i1 (i1 = 0)
S12 SB CORRECTION BASED ON i1-TH ECC FRAME
S13 IS SB CORRECTION SUCCESSFUL?
YES
NO
S14 IS HE CONDITION SATISFIED?
YES
NO
S15 OTHER PROCESSINGS
S16 CALCULATE dRu BASED ON CHANNEL MATRIX
S17 IS i-TH ECC FRAME LAST ECC FRAME?
NO
YES
S18 INCREMENT i1 (i1++)
END

FIG. 11

| index1 | 1 | 2 | 3 | 4 | 5 | 6 | 7 | 8 |
|---|---|---|---|---|---|---|---|---|
| LLR | −9 | −5 | −3 | −1 | +1 | +3 | +5 | +9 |

FIG. 12A
| index1 | | 1 | 2 | 3 | 4 | 5 | 6 | 7 | 8 |
|---|---|---|---|---|---|---|---|---|---|
| DLECNT | 0 | N0[1] | N0[2] | N0[3] | N0[4] | N0[5] | N0[6] | N0[7] | N0[8] |
| | 1 | N1[1] | N1[2] | N1[3] | N1[4] | N1[5] | N1[6] | N1[7] | N1[8] |
FIG. 12B
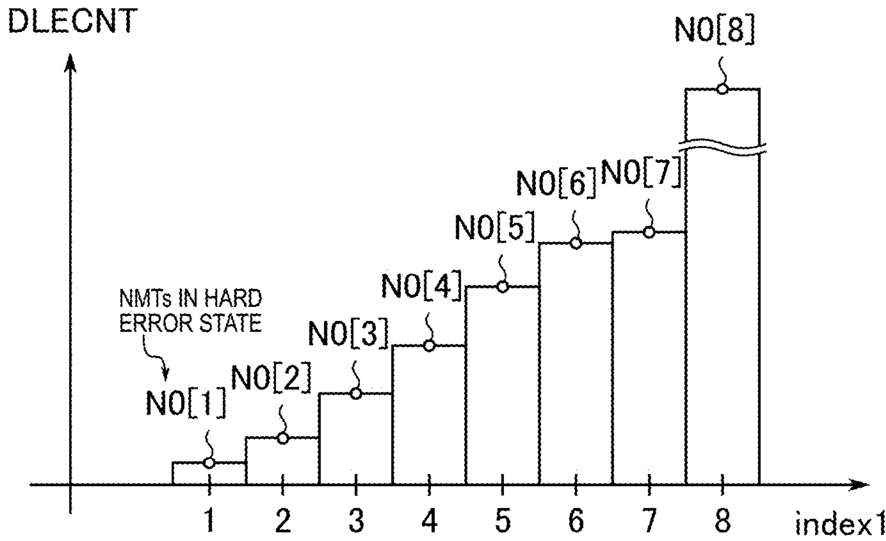
FIG. 12C
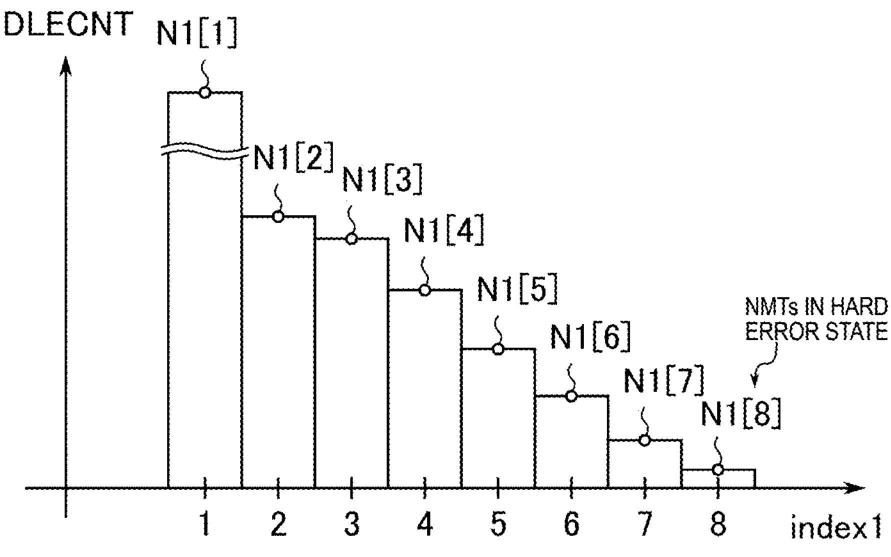

FIG. 13A
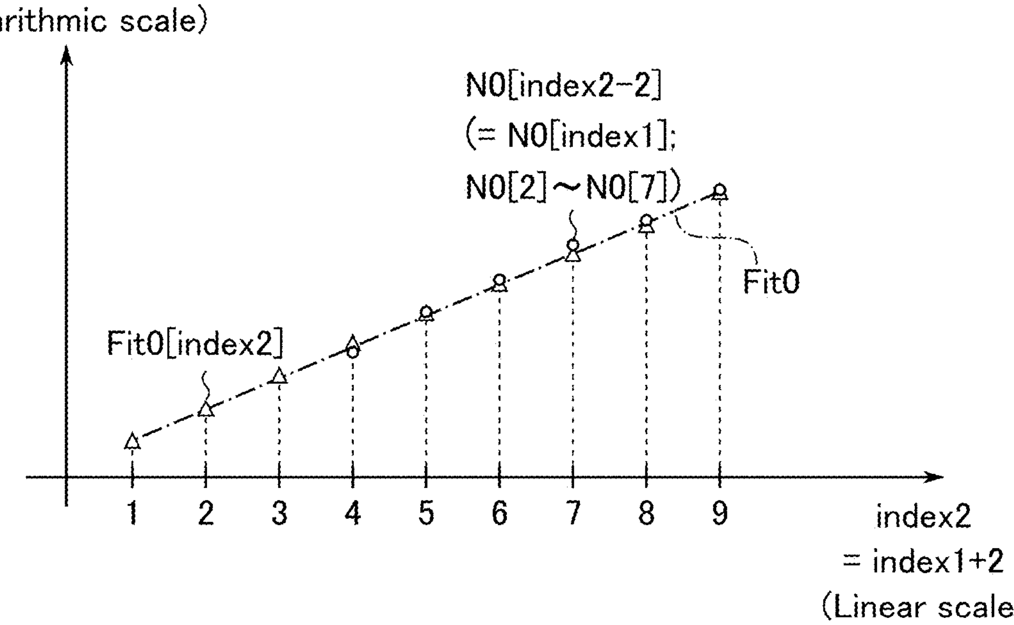
FIG. 13B
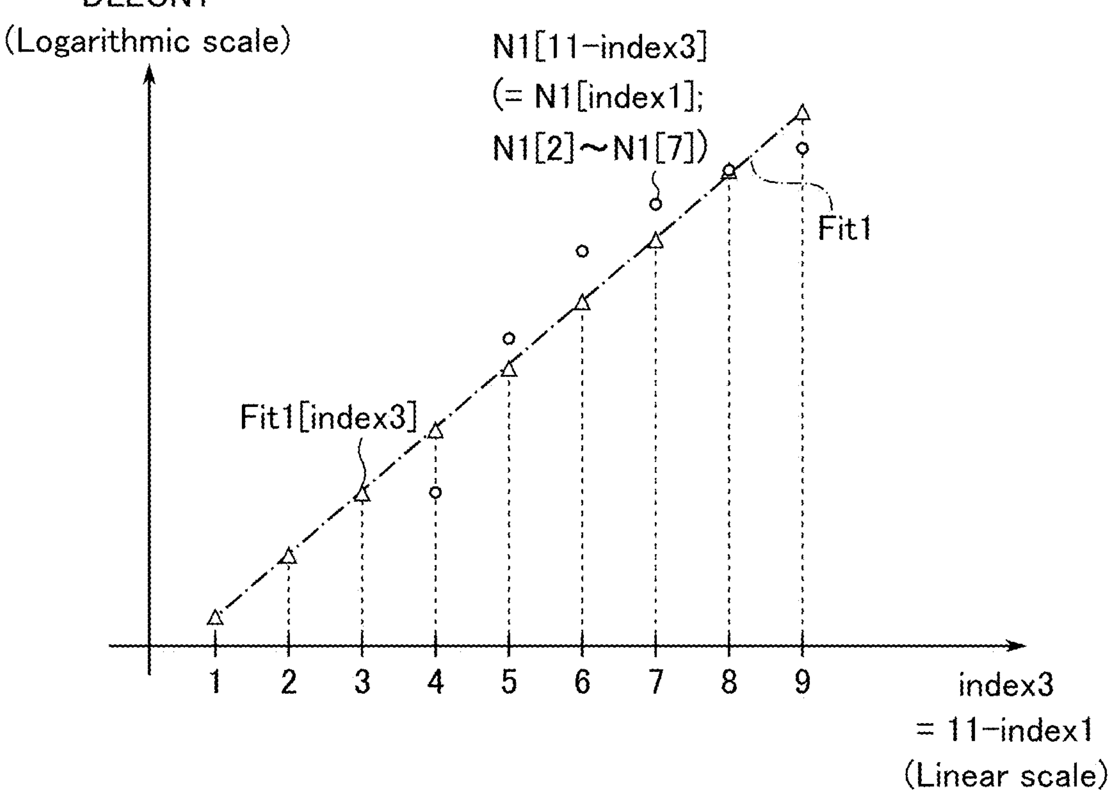

FIG. 15

MEMORY SYSTEM

CROSS-REFERENCE TO RELATED APPLICATION(S)

This application is based upon and claims the benefit of priority from Japanese Patent Application No. 2023-100906, filed Jun. 20, 2023, the entire contents of which are incorporated herein by reference.

FIELD

Embodiments described herein relate generally to a memory system.

BACKGROUND

A memory system, which includes a memory device capable of storing data in a non-volatile manner and a controller that controls the memory device, is known. The memory system corrects an error in data, for example, when reading out the data from the memory device.

DESCRIPTION OF THE DRAWINGS

FIG. 4 is a diagram for showing a threshold voltage distribution of a memory cell transistor provided in the NAND memory in the embodiment.

FIG. 10 is a flowchart for showing a flow of a correction process based on soft bit data of the memory system according to the embodiment.

FIG. 11 is a diagram for showing a log-likelihood ratio table used for error correction in the memory system according to the embodiment.

FIGS. 12A to 12C are diagrams for showing generation of a channel matrix executed in the memory system according to the embodiment.

FIGS. 13A and 13B are diagrams for showing calculation of a shift voltage of soft bit read executed in the memory system according to the embodiment.

FIG. 15 is a flowchart for showing a flow of a correction process based on soft bit data of a memory system according to a modification example.

DETAILED DESCRIPTION

Figure 1:
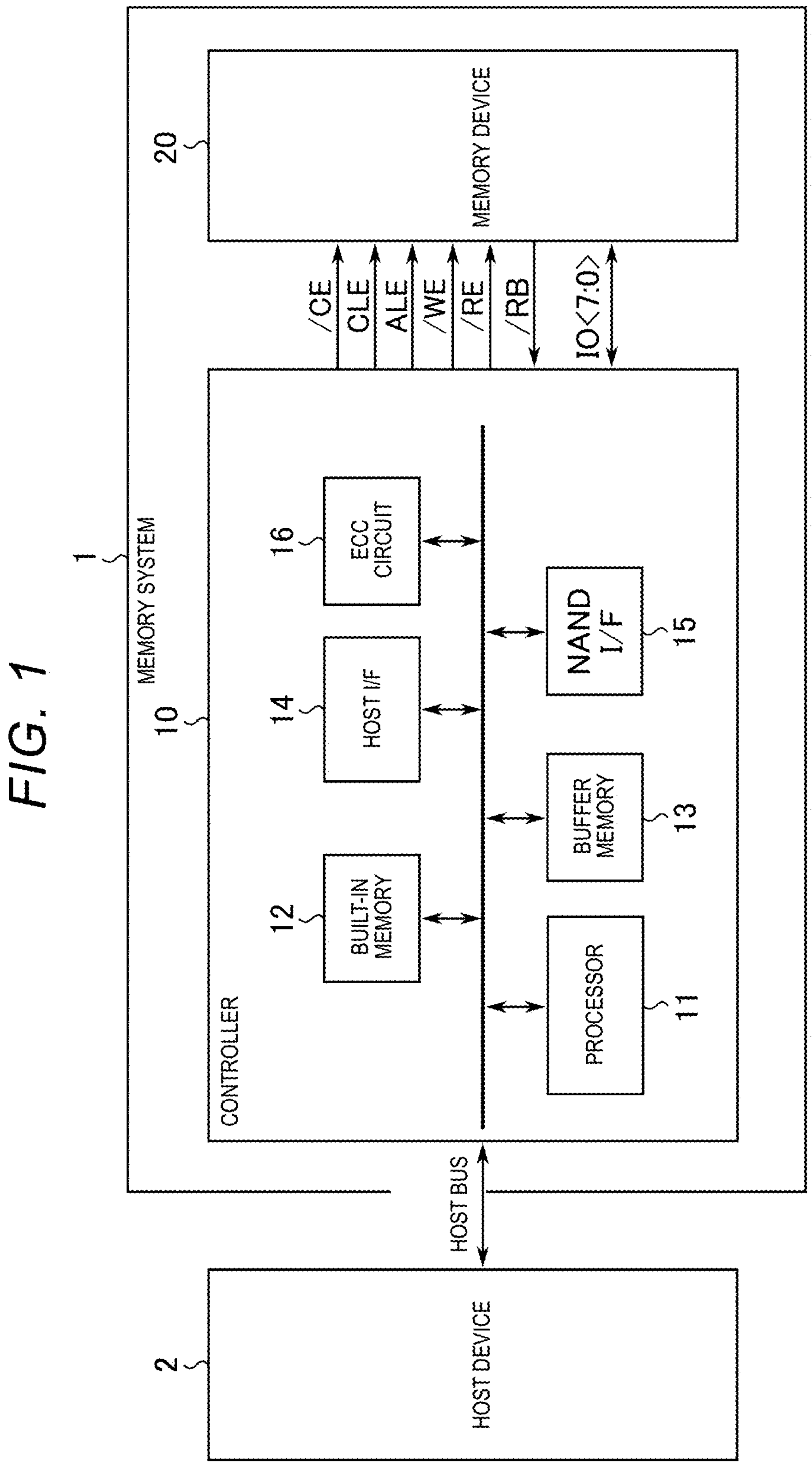
FIG. 1 is a block diagram showing an example of a configuration of an information processing system including a host system and a memory system according to an embodiment.

Embodiments provide a memory system having an improved error correction capability.

In general, according to one embodiment, the memory system includes a semiconductor memory including a plurality of first memory cells each configured to store data in a non-volatile manner according to a threshold voltage, and a controller. The controller is configured to perform a first error correction process for the plurality of first memory cells, based on first hard bit data and first soft bit data acquired using a plurality of first soft bit voltages that have been calculated based on a shift voltage, and to correct the shift voltage when a condition based on correction data generated during the first error correction process, is satisfied.

Hereinafter, embodiments will be described with reference to drawings. In the following description, the same reference numerals are added to elements having substantially the same function and configuration. Letters or numerals different from each other may be added to the end of the same reference numerals when specifically distinguishing between elements having similar configurations.

1. Embodiment

1.1 Configuration

1.1.1 Memory System

A configuration example of a memory system will be described with reference to FIG. 1. FIG. 1 is a block diagram showing an example of a configuration of an information processing system including a host device and a memory system according to an embodiment.

The memory system 1 includes a controller 10 and a memory device 20.

A memory system 1 is, for example, a solid state drive (SSD) or an SD® card. The memory system 1 communicates with, for example, an external host device 2. The memory system 1 stores data from the host device 2. In addition, the memory system 1 also reads data provided to the host device 2.

The controller 10 is configured with, for example, an integrated circuit such as a system-on-a-chip (SoC). The controller 10 receives a command from the host device 2. The functions of each unit of the controller 10 may be implemented with dedicated hardware, a processor that executes a program (firmware), or a combination thereof. The controller 10 controls the memory device 20 based on the received command. Specifically, the controller 10 writes data specified in a write command received from the host device 2, into the memory device 20, based on the write command. In addition, the controller 10 reads out data requested in a read command received from the host device 2, from the memory device 20, and transmits the data to the host device 2 based on a readout command received from the host device 2.

The memory device 20 is, for example, a semiconductor memory. In addition, the memory device 20 is, for example, a NAND-type flash memory. Hereinafter, the memory device 20 will be referred to as a NAND memory 20. The NAND memory 20 includes a plurality of memory cell transistors. The NAND memory 20 stores data in a non-volatile manner. The NAND memory 20 is connected to the controller 10 via a NAND bus.

The NAND bus communicates various signals in accordance with a NAND interface via individual signal lines. The various signals include, for example, IO<7:0>,/CE, CLE, ALE,/WE,/RE, and/RB. A signal/CE is a chip enable (CE) signal. The signal/CE is a signal for enabling the NAND memory 20. The signal CLE is a command latch enable signal. The signal CLE notifies the NAND memory 20 that a signal IO<7:0> transmitted to the NAND memory 20 while the signal CLE is at the "H (High)" level is a command. A signal ALE is an address latch enable (ALE) signal. The signal ALE notifies the NAND memory 20 that the signal IO<7:0> transmitted to the NAND memory 20 while the signal ALE is at the "H" level is the address. A signal/WE is a write enable (WE) signal. The signal/WE instructs the NAND memory 20 to take in the signal IO<7:0>. A signal/RE is a read enable (RE) signal. The signal/RE instructs the NAND memory 20 to output the signal IO<7:0>. A signal/RB is a ready busy (RB) signal. The signal/RB indicates whether the NAND memory 20 is in a ready state (a state of accepting a command from the outside) or a busy state (a state of not accepting the command from the outside).

The signal IO<7:0> is an 8-bit width signal. The signal IO<7:0> is communicated between the controller 10 and the NAND memory 20. The signal IO<7:0> includes an address, a command, or data. The command is a signal for controlling the entire NAND memory 20. The data includes readout data and write data.

1.1.2 Controller

The controller 10 includes a processor (central processing unit (CPU)) 11, a built-in memory 12, a buffer memory 13, a host I/F (host interface circuit) 14, a NAND I/F (NAND interface circuit) 15, and an error check and correction (ECC) circuit 16.

The processor 11 controls an operation of the entire controller 10. The processor 11 issues a command for instructing an execution of various operations including a writing operation, a readout operation, and an erasing operation on the NAND memory 20, for example.

The built-in memory 12 is, for example, a semiconductor memory such as a static random access memory (SRAM). The built-in memory 12 is used as a work region of the processor 11. The built-in memory 12 stores firmware for managing the NAND memory 20, various management tables including a plurality of compression data tables, and the like.

The buffer memory 13 is, for example, a semiconductor memory such as a dynamic random access memory (DRAM). The buffer memory 13 temporarily stores write data received from the host device 2, or readout data received from the NAND memory 20 by the controller 10, and the like. The buffer memory 13 may be provided outside the controller 10.

The host interface circuit 14 is connected to the host device 2 via a host bus. The host bus is, for example, a bus in accordance with peripheral component interconnect express (PCI EXPRESS® (PCIe)), universal flash storage (UFS), an SD® interface, serial attached small computer system interface (SAS), serial advanced technology attachment (SATA), or non-volatile memory express (NVM EXPRESS® (NVMe)). The host interface circuit 14 controls communication between the controller 10 and the host device 2. The host interface circuit 14 transfers, for example, the command and the data received from the host device 2, to the processor 11 and the buffer memory 13, respectively.

The NAND interface circuit 15 is connected to the NAND memory 20 via the NAND bus. The NAND bus is, for example, a bus according to a toggle NAND (toggle DDR) or an open NAND flash interface (ONFI). The NAND interface circuit 15 controls communication with the NAND memory 20. The NAND interface circuit 15 transmits a command, an address, and write data to the NAND memory 20 in response to an instruction from the processor 11. In addition, the NAND interface circuit 15 receives the readout data from the NAND memory 20.

The ECC circuit 16 performs error detection and error correction regarding the data stored in the NAND memory 20. More specifically, the ECC circuit 16 generates an error correction code when writing data. In addition, the ECC circuit 16 assigns an error correction code (parity) to the write data. The ECC circuit 16 performs error correction using the error correction code during a data readout operation. The error correction includes hard determination decoding (hard bit correction) and soft determination decoding (soft bit correction). In the following description and the drawings, the hard bit is also simply referred to as HB, and the soft bit is also simply referred to as SB. A success probability of the error correction by the soft bit correction may be higher than a success probability of the error correction by the hard bit correction. In the hard bit correction, a Bose-Chaudhuri-Hocquenghem (BCH) code or a Reed-Solomon (RS) code, may be used as the error correction code. In the soft bit correction, a low-density parity-check (LDPC) code may be used. In the following description, the error correction is also referred to as decoding.

1.1.3 Configuration of NAND Memory

Figure 2:
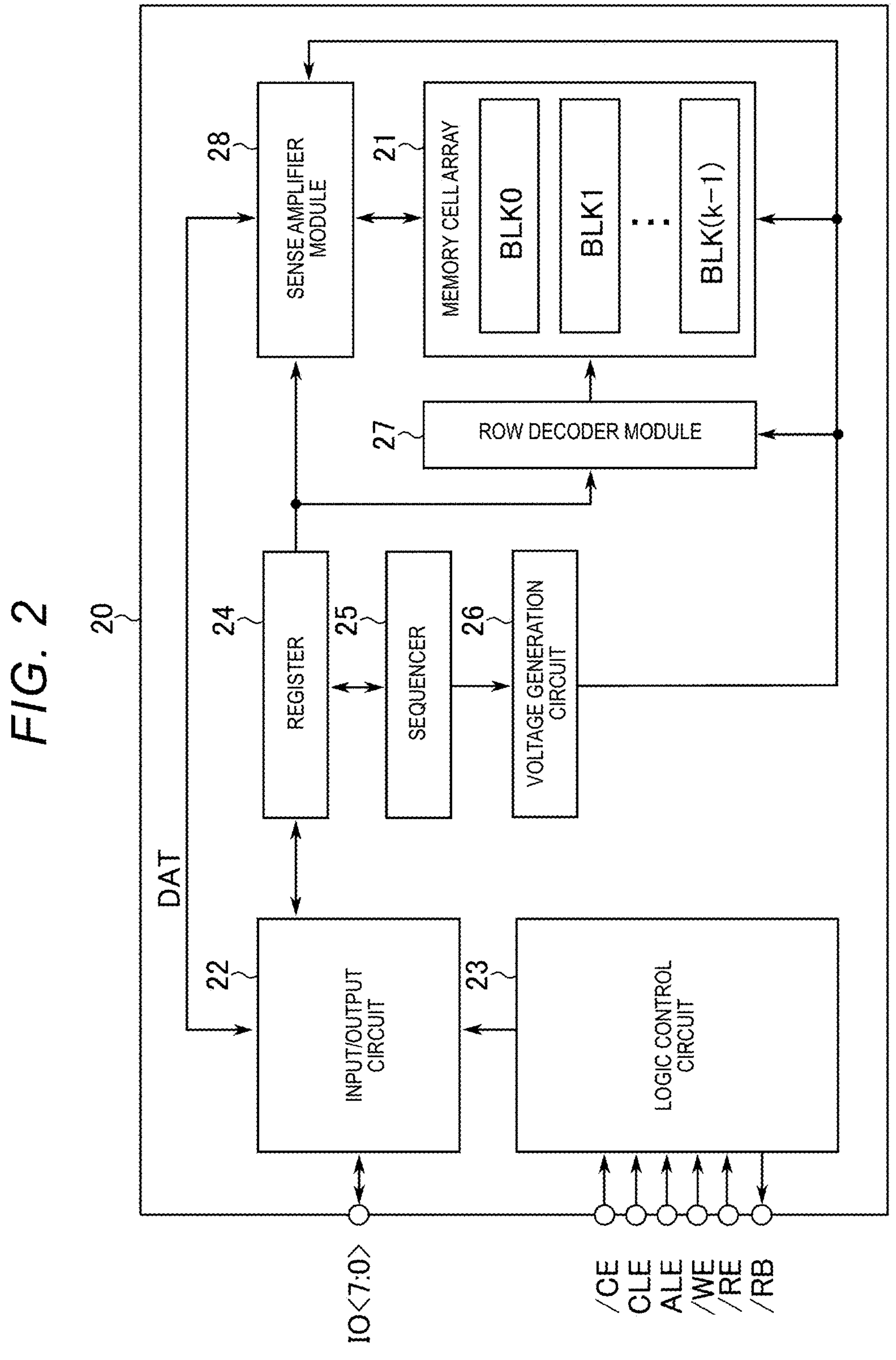
FIG. 2 is a block diagram showing an example of a configuration of a NAND memory in the embodiment.

Next, a configuration example of the NAND memory 20 will be described with reference to FIG. 2. FIG. 2 is a block diagram showing an example of a configuration of a NAND memory in the embodiment.

The NAND memory 20 includes a memory cell array 21, an input/output circuit 22, a logic control circuit 23, a register 24, a sequencer 25, a voltage generation circuit 26, a row decoder module 27, and a sense amplifier module 28.

The memory cell array 21 includes a plurality of blocks BLK0, BLK1, . . . , and BLK(k−1) (k is an integer of 2 or more). Hereinafter, each of the plurality of blocks BLK0, BLK1, . . . , and BLK(k−1) will also be simply referred to as a block BLK. Each block BLK is a set of a plurality of memory cell transistors capable of storing data in a non-volatile manner, and is used, for example, as an erasing unit for data. A plurality of bit lines and a plurality of word lines are provided in the memory cell array 21. One memory cell transistor is associated with, for example, one bit line and one word line.

The input/output circuit 22 communicates a signal IO<7:0> with the controller 10. The input/output circuit 22 transfers a command and an address in the signal IO<7:0> to the register 24. The input/output circuit 22 communicates write data and readout data with sense amplifier module 28.

The logic control circuit 23 receives the signals/CE, CLE, ALE,/WE, and/RE from the controller 10. In addition, the logic control circuit 23 transfers the signal/RB to the controller 10.

The register 24 stores the command and the address. The register 24 transfers the address to the row decoder module 27 and the sense amplifier module 28, and transfers the command to the sequencer 25.

The sequencer 25 receives the command and controls the entire NAND memory 20 in accordance with a sequence based on the received command.

The voltage generation circuit 26 generates a voltage required for the operation such as writing, reading, and erasing of data based on an instruction from the sequencer 25. The voltage generation circuit 26 supplies the generated voltage to the memory cell array 21, the row decoder module 27, and the sense amplifier module 28.

The row decoder module 27 receives the row address in the address from the register 24, and selects the block BLK based on the row address. Then, the voltage from the voltage generation circuit 26 is transferred to the selected block BLK via the row decoder module 27.

When reading out data, the sense amplifier module 28 senses the data stored in the memory cell transistor according to the voltage of the bit line connected to the memory cell transistor, and transfers the sensed data to the input/output circuit 22. When writing data, the sense amplifier module 28 controls the voltage of the bit line according to the write data to be stored in the memory cell transistor connected to the bit line. In addition, the sense amplifier module 28 receives a column address in the address from the register 24, and outputs the data of the column based on the column address.

1.1.4 Configuration of Memory Cell Array

Figure 3:
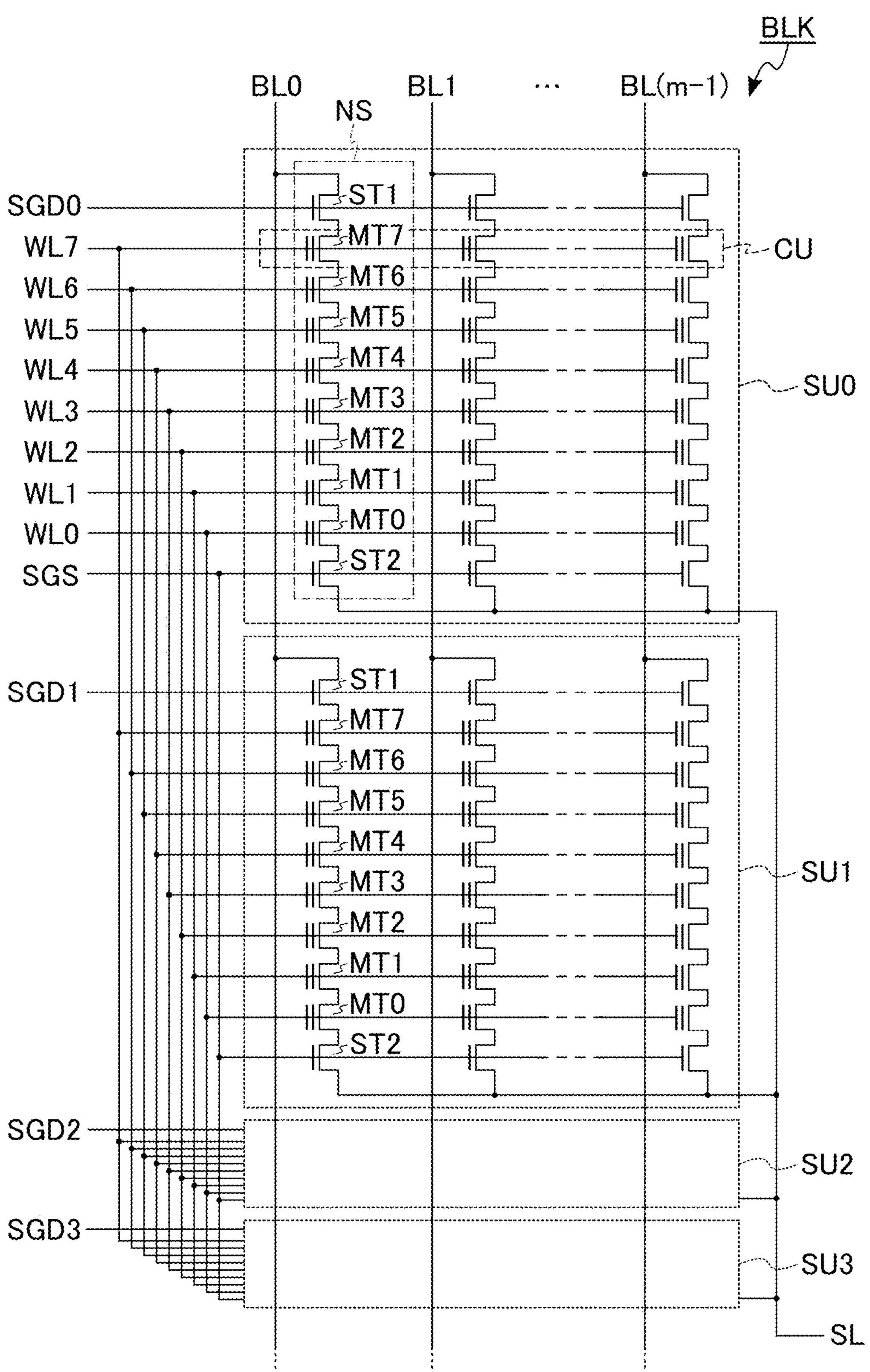
FIG. 3 is a circuit diagram for showing an example of a configuration of a block provided in a memory cell array of the NAND memory in the embodiment.

Next, a configuration of each block BLK provided in the memory cell array 21 of the NAND memory 20 will be described with reference to FIG. 3. FIG. 3 is a circuit diagram for showing an example of a configuration of a block provided in a memory cell array of the NAND memory in the embodiment.

The block BLK includes, for example, four string units SU0, SU1, SU2, and SU3. Hereinafter, each of the four string units SU0, SU1, SU2, and SU3 will also be simply referred to as a string unit SU. Each string unit SU includes a plurality of NAND strings NS. The number of string units SU is not limited to any particular number.

Each of the NAND strings NS includes, for example, eight memory cell transistors MT (MT0 to MT7), and select transistors ST1 and ST2. The number of memory cell transistors MT per NAND string NS is not limited to any particular number. Each of the memory cell transistors MT includes a stacked gate including a control gate and a charge storage layer. Each of the memory cell transistors MT is connected in series between the select transistors ST1 and ST2. In the following description, two configurations are described as connected to each other, even when a conductive element different from that of the two configurations is interposed between the two configurations.

In each block BLK, each of the gates of the select transistor ST1 of the string units SU0 to SU3 is connected to the select gate lines SGD0 to SGD3, respectively. In addition, the gate of the select transistor ST2 of all the string units SU in the block BLK is commonly connected to the select gate line SGS. Each of the control gates of the memory cell transistors MT0 to MT7 in the same block BLK is connected to the word lines WL0 to WL7, respectively. That is, the word lines WL having the same address are commonly connected across all the string units SU in the same block BLK, and the select gate lines SGS are commonly connected across all the string units SU in the same block BLK. On the other hand, the select gate line SGD is connected to only one string unit SU in the same block BLK.

In addition, the other end of the select transistor ST1 of the NAND string NS in the same column among the NAND strings NS arranged in a matrix in the memory cell array 21 is connected to one of m bit lines BL0 to BL (m−1) (where m is an integer of 2 or more). Hereinafter, each of the m bit lines BL0 to BL (m−1) will be simply referred to as a bit line BL. In addition, the bit lines BL are commonly connected to the NAND strings NS in the same column across the plurality of blocks BLK.

In addition, the other end of the select transistor ST2 is connected to a source line SL. The source line SL is commonly connected to the plurality of NAND strings NS across the plurality of blocks BLK.

As described above, erase of data is collectively performed, for example, with respect to the memory cell transistor MT in the same block BLK. On the other hand, the data reading and writing may be collectively performed for the plurality of memory cell transistors MT commonly connected to any one word line WL in any one string unit SU of any one block BLK. As described above, a set of memory cell transistors MT that share the word line WL in one string unit SU, is referred to as a cell unit CU, for example. That is, the cell unit CU is a set of the memory cell transistors MT in which the writing operation or the readout operation is collectively executed. The cell unit CU corresponds to, for example, one or a plurality of sets of storage regions. The writing operation or the readout operation with respect to one cell unit CU is executed with respect to one set of the storage regions. A unit of the above-described storage region is referred to as a page. Hereinafter, a data length of one page are referred to as page data.

1.1.5 Threshold Value Distribution of Memory Cell Transistor

Figure 4:
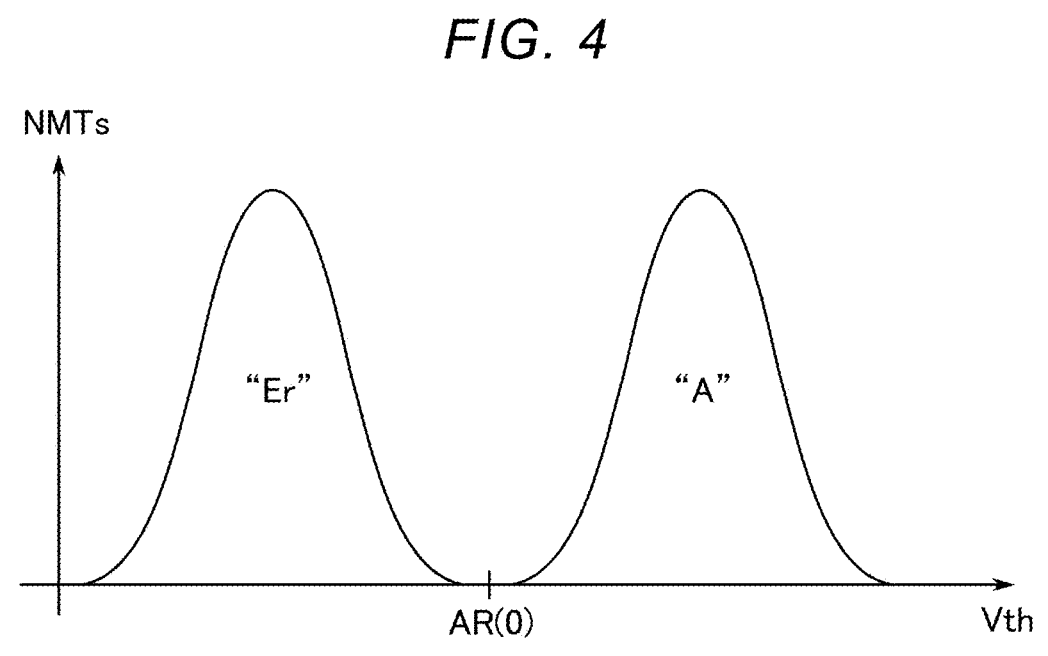

A threshold voltage distribution of the memory cell transistor MT provided in the NAND memory 20 will be described with reference to FIG. 4. FIG. 4 is a diagram for showing an example of a threshold voltage distribution of a memory cell transistor provided in the NAND memory in the embodiment. FIG. 4 shows an example of the threshold voltage distribution of the memory cell transistor MT in the NAND memory 20. A vertical axis of the threshold voltage distribution shown in FIG. 4 corresponds to the number of memory cell transistors MT, and a horizontal axis corresponds to the threshold voltage of the memory cell transistor MT. In the description of FIG. 4 and the following, the number and the threshold voltage of the memory cell transistors MT are also referred to as NMTs and Vth, respectively.

As shown in FIG. 4, the threshold voltage distribution of the memory cell transistors MT provided in the NAND memory 20 may have, for example, two states. Hereinafter, the two states will be referred to as an “Er” state and an “A” state in order of increasing the threshold voltage.

The “Er” state corresponds to, for example, a data erased state. The threshold voltage of the memory cell transistor MT provided in the “Er” state is, for example, less than a voltage AR(0).

The “A” state corresponds to a state in which a charge is injected into the charge storage layer of the memory cell transistor MT. The threshold voltage of the memory cell transistor MT provided in the “A” state is, for example, the voltage AR(0) or higher.

The memory cell transistor MT is turned on when the memory cell transistor MT has a threshold voltage lower than a voltage applied to the control gate thereof. The memory cell transistor MT is turned off when the memory cell transistor MT has a threshold voltage equal to or higher than the voltage applied to the control gate thereof.

Different values of 1-bit data are assigned to the “Er” state and the “A” state, respectively. For example, value of “1” is assigned to the “Er” state. For example, value of “0” is assigned to the “A” state.

When the assignment is made in the above-described manner, one-page data is determined by the data readout processing using the voltage AR(0), for example. Hereinafter, the processing of acquiring the determination result based on which of the two values of data are assigned, is determined by one readout voltage set for two adjacent states, will be referred to as hard bit read. In addition, the one readout voltage is referred to as a hard bit voltage. In addition, the page data acquired by the hard bit read for a certain page in the block BLK, is referred to as hard bit data. In addition, each bit of the hard bit data is referred to as a hard bit.

1.1.6 ECC Circuit

Figure 5:
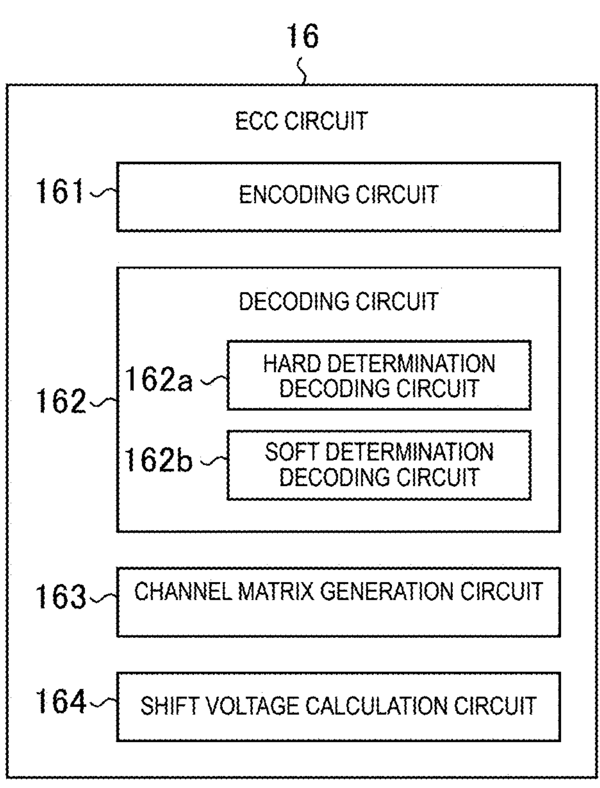
FIG. 5 is a diagram for showing an example of a configuration of an ECC circuit provided in the memory system according to the embodiment.

A configuration of the ECC circuit 16 provided in the controller 10 will be described with reference to FIG. 5. FIG. 5 is a diagram for showing an example of a configuration of an ECC circuit provided in the memory system according to the embodiment.

The ECC circuit 16 includes an encoding circuit 161, a decoding circuit 162, a channel matrix generation circuit 163, and a shift voltage calculation circuit 164.

The encoding circuit 161 is a circuit that performs encoding processing. The encoding circuit 161 generates an error correction code in the encoding processing. In addition, the encoding circuit 161 assigns an error correction code to the write data in the encoding processing.

The decoding circuit 162 includes a hard determination decoding circuit 162*a* and a soft determination decoding circuit 162*b*.

The hard determination decoding circuit 162*a* is a circuit that performs hard bit correction. The hard determination decoding circuit 162*a* performs error correction using a hard determination decoding code. More specifically, the hard determination decoding circuit 162*a* detects an error in the data read out by using the hard determination decoding code with respect to the hard bit data. When the error is detected, the hard determination decoding circuit 162*a* corrects the error of the readout data.

The soft determination decoding circuit 162*b* is a circuit that performs soft bit correction. The soft determination decoding circuit 162*b* performs error correction using a log-likelihood ratio (LLR) table and a soft determination decoding code. The LLR table, which will be described later, is a table relating to a likelihood of the data value read out from the memory cell transistor MT. In the soft bit correction, the soft determination decoding circuit 162*b* performs iterative process for each ECC frame by using the LLR table and the soft determination decoding code, with respect to the hard bit data and the soft bit data. The soft bit data is page data acquired by the soft bit read for a certain page in the block BLK. The soft bit read, which will be described below, is a process of determining the soft bit by a data read processing using a plurality of readout voltages (e.g., soft bit voltages) set with reference to the hard bit voltage. Each bit included in the soft bit data is referred to as the soft bit. In addition, the ECC frame is, for example, a unit of data for which the soft determination decoding is performed by the soft determination decoding circuit 162*b*. One or more ECC frames may be provided in the hard bit data and the soft bit data. The soft determination decoding circuit 162*b* corrects an error in the readout data based on the result of the iterative process.

The channel matrix generation circuit 163 is a circuit that generates the channel matrix by using the hard bit data and the soft bit data. The channel matrix is a matrix relating to an expected value of the number of memory cell transistors MT having the value of "0" and an expected value of the number of memory cell transistors MT having the value of "1". Details of the channel matrix will be described below. The channel matrix generation circuit 163 generates the channel matrix for each ECC frame, for example.

The shift voltage calculation circuit 164 is a circuit for determining the plurality of soft bit voltages. The shift voltage calculation circuit 164 calculates, for example, a shift voltage dRu regarding a difference between the plurality of soft bit voltages. The calculated shift voltage dRu is stored in, for example, the built-in memory 12. The shift voltage calculation circuit 164 updates the stored shift voltage dRu, for example, each time the shift voltage dRu is determined. The shift voltage dRu will be described below. The shift voltage calculation circuit 164 may be provided in a configuration different from that of the ECC circuit 16 in the controller 10.

1.1.7 Configuration of Data Stored in Built-In Memory

Figure 6:
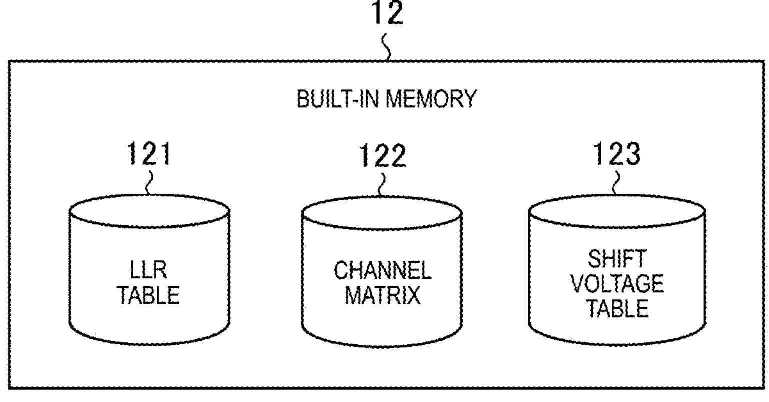
FIG. 6 is a block diagram for showing an example of a configuration of data stored in a built-in memory provided in the memory system according to the embodiment.

A configuration of the data stored in the built-in memory 12 will be described with reference to FIG. 6. FIG. 6 is a block diagram for showing an example of a configuration of data stored in the built-in memory provided in the memory system according to the embodiment.

The built-in memory 12 includes, for example, an LLR table 121, a channel matrix 122, and a shift voltage table 123.

The LLR table 121 includes a log-likelihood ratio (LLR value). The LLR value is information representing the likelihood that the bit stored in the memory cell transistor MT is "0" and the likelihood that the bit stored in the memory cell transistor MT is "1", by the log ratio. The LLR value is information relating to the likelihood of the data read out by a certain readout voltage. The LLR value is assigned to a range threshold voltages. In the description of the operation described later, an example of the LLR table 121 in the embodiment will be shown.

The built-in memory 12 may include a plurality of LLR tables 121. Each of the plurality of LLR tables is set in consideration of the variation in the threshold voltage of the memory cell transistor MT due to various influences. One LLR table used for the soft bit correction among the plurality of LLR tables may be selected by the ECC circuit 16.

The channel matrix 122 stores the expected value of the number of memory cell transistors MT having data of "0" and the expected value of the number of memory cell transistors MT having data of "1" for each threshold voltage range represented in the LLR table 121. It should be noted that, in the description of the operation described later, an example of the channel matrix 122 in the embodiment will be shown.

The shift voltage table 123 stores, for example, the calculated shift voltage dRu and the shift voltage dRdef. The shift voltage dRdef is used as an initial value, when determining the plurality of soft bit voltages used for the soft bit read. The shift voltage dRdef may be, for example, a fixed value. It should be noted that, in the following description, when the shift voltages dRu and dRdef are not distinguished from each other, each of the shift voltages dRu and dRdef is also simply referred to as a shift voltage dR.

1.2 Operation

Hereinafter, a readout operation using the memory system 1 according to the embodiment will be described.

1.2.1 Overall Operation

Figure 7:
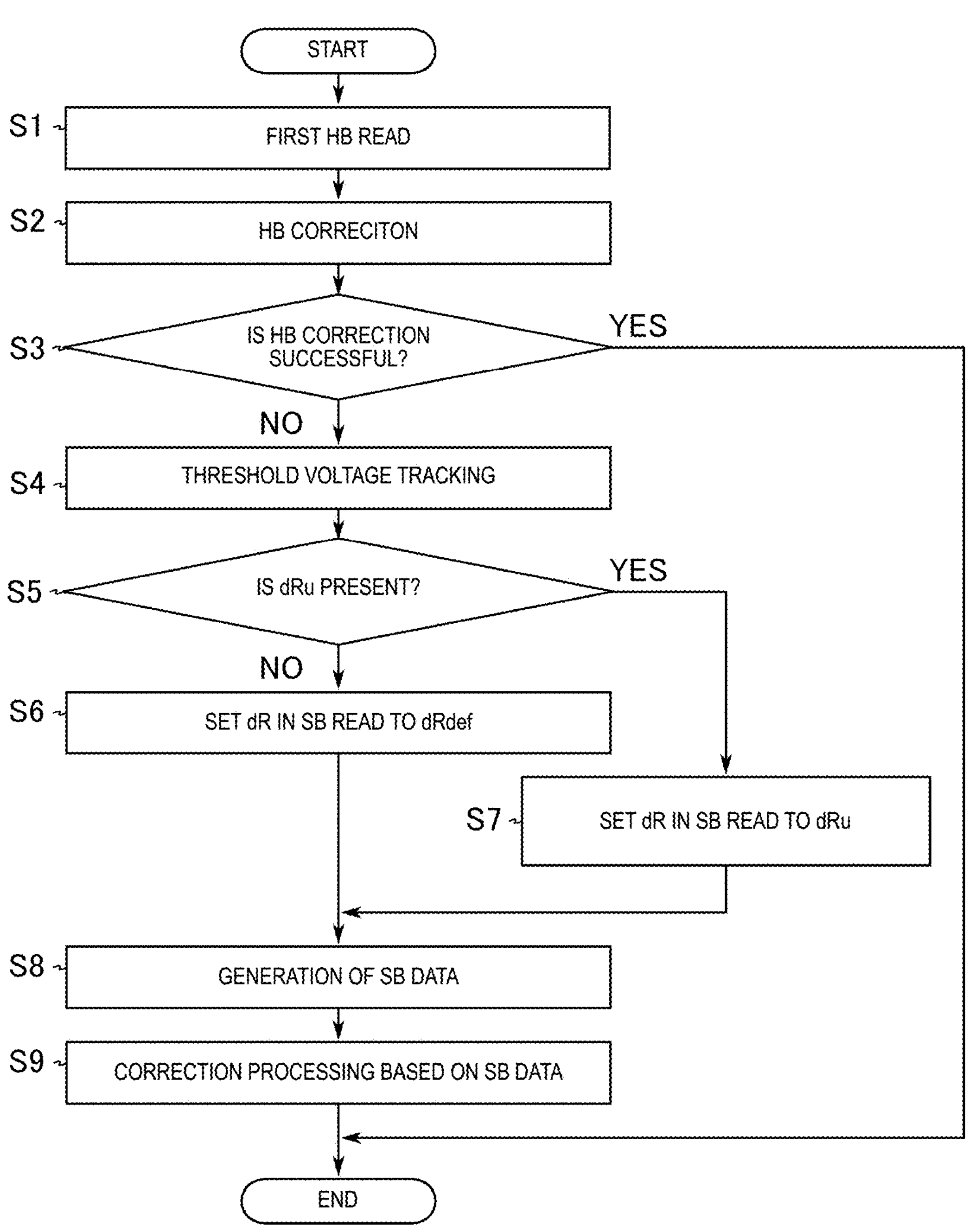
FIG. 7 is a flowchart for showing an overall flow of a readout operation using the memory system according to the embodiment.

First, an overall flow of a readout operation using the memory system 1 according to the embodiment will be described with reference to FIG. 7. FIG. 7 is a flowchart for showing an overall flow of a readout operation using the memory system according to the embodiment. In the following, readout processing for a certain one page in the block BLK will be described.

In S1, when the readout operation is started, the controller 10 applies the hard bit voltage to the selected word line WL. Then, the hard bit read of acquiring the hard bit data corresponding to the one page in the selected block BLK, is performed. The hard bit voltage is set to, for example, a default readout voltage AR(0) or a voltage shifted from the readout voltage AR(0). The read hard bit data is stored in the buffer memory 13. Then, the processing proceeds to S2. It should be noted that the hard bit read in S1 of the embodiment is referred to as a first hard bit read. In addition, the hard bit data read out by the first hard bit read is referred to as first hard bit data.

In S2, the hard determination decoding circuit 162*a* corrects the hard bits for each ECC frame, for example, by using the first hard bit data. Then, the processing proceeds to S3.

In S3, the controller 10 determines whether the hard bit correction of all the ECC frames provided in the first hard bit data is successful. When the hard bit correction of all the ECC frames provided in the first hard bit data is successful (S3; YES), the readout operation is ended. When the first hard bit data includes the ECC frame in which the hard bit correction has failed (S3; NO), the processing proceeds to S4.

The following is a supplemental description of the step of S3. Immediately after the writing operation, in the threshold voltage distribution, the "Er" state and the "A" state diverge from each other, for example, as shown in FIG. 4. With the above-described threshold voltage distribution, for example, the correct page data may be read out by executing the first hard bit read using the default readout voltage AR(0) and the hard bit correction.

Figure 8:
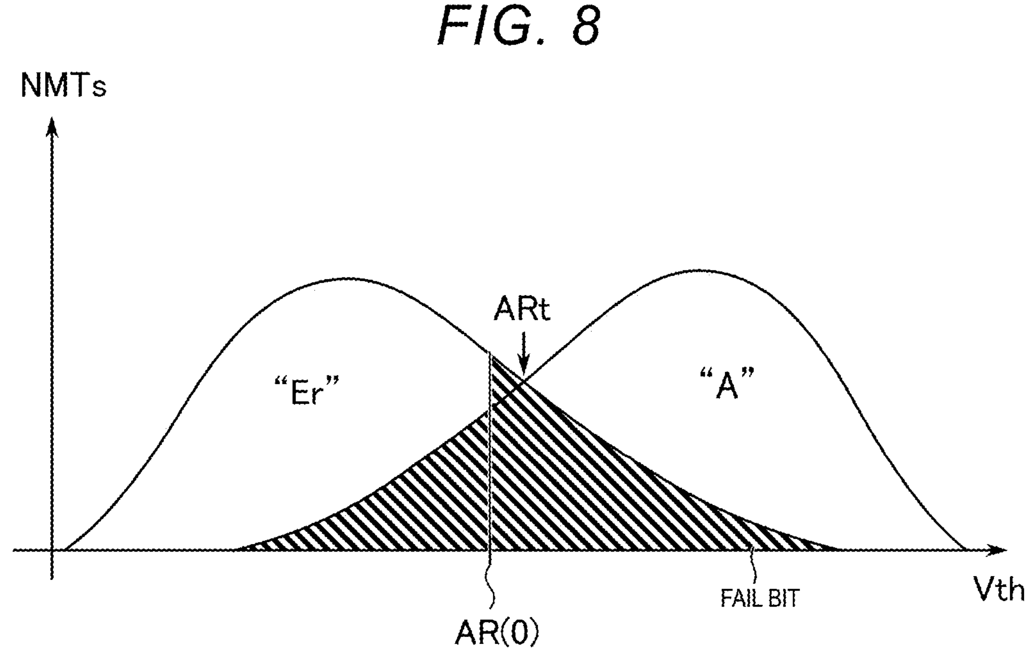
FIG. 8 is a diagram for showing a variation in the threshold voltage distribution of the memory cell transistor provided in the NAND memory in the embodiment.

Meanwhile, as shown in FIG. 8, two adjacent states may overlap in the threshold voltage distribution due to various influences on the memory cell transistor MT. FIG. 8 is a diagram for showing a variation in a threshold voltage distribution of a memory cell transistor provided in the NAND memory in the embodiment.

At this time, the controller 10 may not be able to determine a state of a certain memory cell transistor MT at the time of writing by the first hard bit read using the readout voltage AR(0). A bit that cannot be determined as described above is referred to as a fail bit. More specifically, for example, in the threshold voltage distribution shown in FIG. 8, when the first hard bit read using the readout voltage AR(0) is executed, as shown in a hatched line portion in FIG. 8, the memory cell transistors MT having the threshold voltage equal to or higher than the readout voltage AR(0) among the memory cell transistors MT provided in the "Er" state and the memory cell transistors MT having the threshold voltage lower than the readout voltage AR(0) among the memory cell transistors MT provided in the "A" state enter the memory cell transistors MT of which the state during writing cannot be determined. When the number of fail bits exceeds the number of errors correctable by the hard bit correction, the controller 10 fails in the hard bit correction.

Returning to FIG. 7, when the hard bit correction fails (S3; NO), the controller 10 executes, for example, the threshold voltage tracking in S4. As a result, the controller 10 calculates, for example, a readout voltage, in particular the tracking voltage ARt, such that the number of fail bits is reduced, as in a position indicated by an arrow in FIG. 8. That is, the tracking voltage is, for example, a readout voltage which is a threshold voltage in the vicinity of the intersection of the "Er" state and the "A" state.

In S5, for example, the controller 10 determines whether the shift voltage calculation circuit 164 stores the shift voltage dRu. When the shift voltage calculation circuit 164 stores the shift voltage dRu (S5; YES), the processing proceeds to S7. When the shift voltage calculation circuit 164 does not store the shift voltage dRu (S5; NO), the processing proceeds to S6. The shift voltage dR will be described in detail below.

In S6, the controller 10 sets the shift voltage dR to the shift voltage dRdef stored as the initial value. Then, the processing proceeds to S8.

In S7, the controller 10 sets the shift voltage dR to the stored shift voltage dRu. Then, the processing proceeds to S8.

In S8, first, the controller 10 executes the hard bit read using the tracking voltage ARt. It should be noted that the hard bit read using the tracking voltage ARt is referred to as a second hard bit read. In addition, the hard bit data read out by the second hard bit read is referred to as second hard bit data. Then, the controller 10 executes the soft bit read using the plurality of soft bit voltages based on the tracking voltage ARt and the set shift voltage dR. As a result, the controller 10 acquires the soft bit data. Thereafter, the processing proceeds to S9. Details of the soft bit read will be described below.

In S9, the controller 10 executes the correction process based on the soft bit data. The correction process based on the soft bit data includes soft bit correction. The correction process based on the soft bit data will be described below.

As described above, the readout operation using the memory system 1 according to the embodiment is ended.

1.2.2 Soft Bit Read

Figure 9:
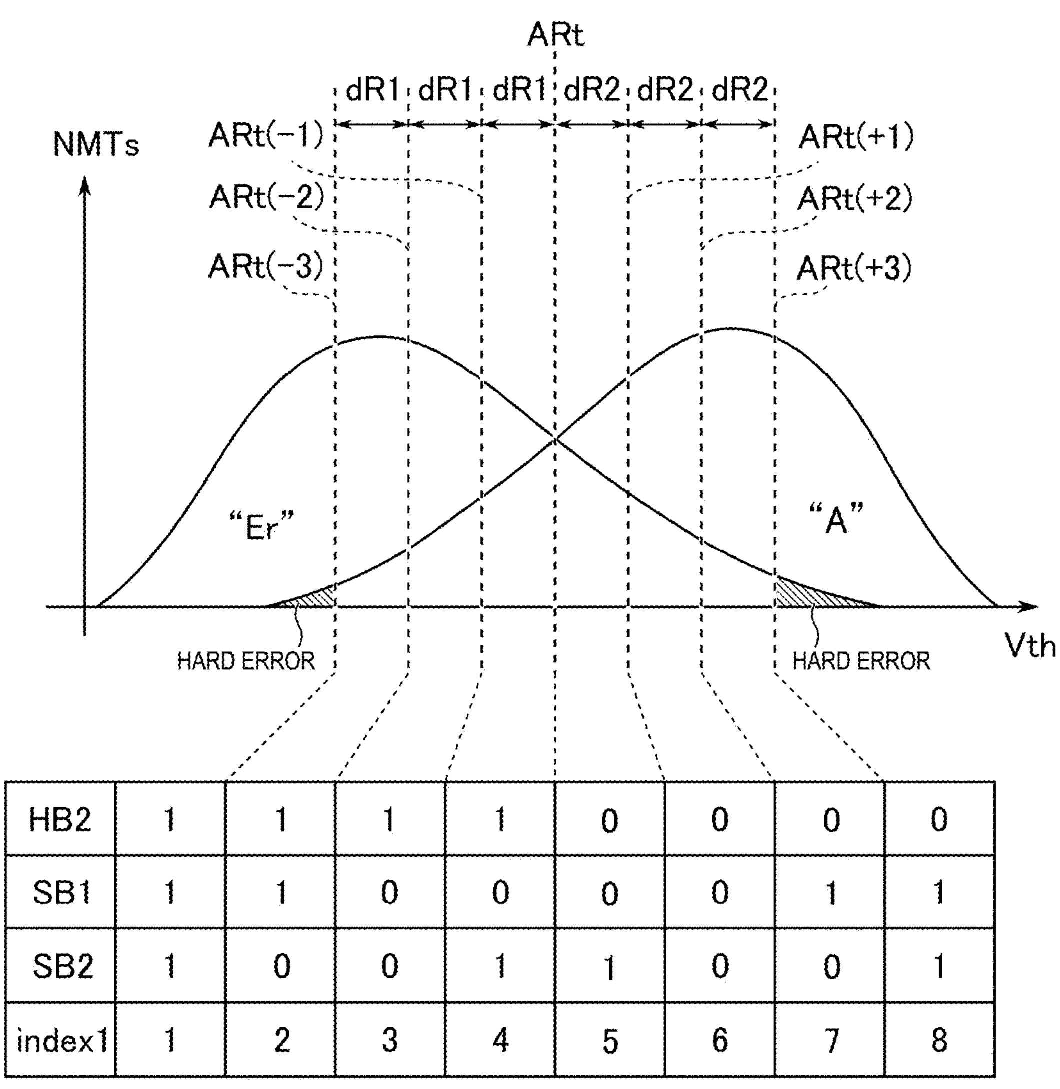
FIG. 9 is a diagram for showing an example of soft bit read in the memory system according to the embodiment.

The soft bit read will be described with reference to FIG. 9. FIG. 9 is a diagram for showing an example of the soft bit read in the memory system according to the embodiment.

The soft bit read includes, for example, a data readout process using a plurality of soft bit voltages set based on the shift voltage dR with the tracking voltage ARt as a reference. The shift voltage dR includes the shift voltages dR1 and dR2. In FIG. 9, the soft bit voltage is the voltages ARt (−3), ARt(−2), ARt(−1), ARt(+1), ARt(+2), and ARt(+3). The voltage ARt(−3) has a lower voltage with respect to the voltage ARt(−2), by the shift voltage dR1. The voltage ARt(−2) has a lower voltage with respect to the voltage ARt(−1), by the shift voltage dR1. The voltage ARt(−1) has a lower voltage with respect to the tracking voltage ARt, by the shift voltage dR1. The voltage ARt(+1) has a higher voltage with respect to the tracking voltage ARt, by the shift voltage dR2. The voltage ARt(+2) has a higher voltage with respect to the voltage ARt(+1), by the shift voltage dR2. The voltage ARt(+3) has a higher voltage with respect to the voltage ARt(+2), by the shift voltage dR2. The shift voltages dR1 and dR2 may be different from each other or may be the same.

The shift voltage dRdef in the initial state includes a shift voltage dRdef1 used as the shift voltage dR1 and a shift voltage dRdef2 used as the shift voltage dR2. The shift voltages dRdef1 and dRdef2 may be different from each other or may be the same. In addition, the calculated shift voltage dRu includes the shift voltage dRu1 used as the shift voltage dR1 and the shift voltage dRu2 used as the shift voltage dR2. It should be noted that the combination of the plurality of soft bit voltages is not limited to the above-described combination.

The threshold voltage is classified into eight regions by the soft bit voltage and the tracking voltage as described above. Hereinafter, the eight regions are designated by "index1" in order of increasing the threshold voltage. The region of the index1 "1" is a region in which the threshold voltage is less than the voltage ARt(−3). The region of the index1 "2" is a region in which the threshold voltage is equal to or higher than the voltage ARt(−3) and is lower than the voltage ARt(−2). The region of the index1 "3" is a region in which the threshold voltage is equal to or higher than the voltage ARt(−2) and is lower than the voltage ARt(−1). The region of the index1 "4" is a region in which the threshold voltage is equal to or higher than the voltage ARt(−1) and is lower than the tracking voltage ARt. The region of the index1 "5" is a region in which the threshold voltage is equal to or higher than the tracking voltage ARt and is lower than the voltage ARt(+1). The region of the index1 "6" is a region in which the threshold voltage is equal to or higher than the voltage ARt(+1) and is lower than the voltage ARt(+2). The region of the index1 "7" is a region in which the threshold voltage is equal to or higher than the voltage ARt(+2) and is lower than the voltage ARt(+3). The region of the index1 "8" is a region in which the threshold voltage is equal to or higher than the voltage ARt(+3).

The hard bit included in the second hard bit data acquired by the second hard bit read using the tracking voltage ARt, is referred to as a hard bit HB2. When the threshold voltage of the memory cell transistor MT is provided in the region designated by the index1 "1" to index1 "4", the hard bit HB2 is "1". When the threshold voltage of the memory cell transistor MT is provided in the region designated by the index1 "5" to index1 "8", the hard bit HB2 is "0".

In addition, the soft bit read includes a process of acquiring a result of the logical operation using the data acquired by the readout process using the above-described plurality of readout voltages. The result of the logical operation acquired as the page data by the soft bit read, is the soft bit data. The soft bit data includes first soft bit data and second soft bit data. Hereinafter, the soft bit included in the first soft bit data is referred to as a first soft bit SB1. In addition, the soft bit included in the second soft bit data is referred to as a second soft bit SB2.

The first soft bit data is acquired by, for example, an exclusive negative OR (XNOR) operation on the plurality of values of data read out from the memory cell transistor MT using the voltages ARt(−2) and ARt(+2), respectively. When the threshold voltage of the memory cell transistor MT is provided in the region designated by the index1 "1", index1 "2", index1 "7", and index1 "8", the first soft bit SB1 is "1". When the threshold voltage of the memory cell transistor MT is provided in the region designated by the index1 "3" to index1 "6", the first soft bit SB1 is "0".

The second soft bit data is acquired by, for example, an exclusive negative OR (XNOR) operation on the plurality of values of data read out from the memory cell transistor MT using the voltages ARt(−3), ARt(−1), ARt(+1), and ARt(+3), respectively. When the threshold voltage of the memory cell transistor MT is provided in the region designated by the index1 "1", index1 "4", index1 "5", and index1 "8", the second soft bit SB2 is "1". When the threshold voltage of the memory cell transistor MT is provided in the region designated by the index1 "2", index1 "3", index1 "6", and index1 "7", the second soft bit SB2 is "0".

In FIG. 9, the memory cell transistors MT provided in the region of the memory cell transistor MT in the "Er" state, in which the threshold voltage is designated by the index1 "8", and the memory cell transistors MT provided in the region of the memory cell transistor MT in the "A" state, in which the threshold voltage is designated by the index1 "1", are referred to as the memory cell transistors MT having a hard error state. When the number of memory cell transistors MT having a hard error state is increased, the success rate of the soft bit correction is reduced. Therefore, it is desired that the number of memory cell transistors MT having a hard error state is small.

1.2.3 Correction Process Based on Soft Bit Data

The correction process based on the soft bit data of S9 will be described with reference to FIG. 10. FIG. 10 is a flowchart for showing a flow of a correction process based on soft bit data of the memory system according to the embodiment.

In S11, a variable i1 is initialized (i1=0). Then, the processing proceeds to S12.

In S12, the soft determination decoding circuit 162*b* converts the combination of the hard bit HB2, the first soft bit SB1, and the second soft bit SB2 into the LLR value by using the LLR table 121 for the i1-th ECC frame. The soft determination decoding circuit 162*b* executes the soft bit correction for the i1-th ECC frame by using the converted LLR value and the soft determination decoding code assigned to the data by the ECC circuit 16. Then, the channel matrix generation circuit 163 generates the channel matrix 122. Then, the processing proceeds to S13. The generation of the channel matrix 122 will be described below.

The LLR table 121 will be supplemented with reference to FIG. 11. FIG. 11 is a diagram for showing a log-likelihood ratio table used for error correction in the memory system according to the embodiment.

The LLR table stores the LLR value for each index1, for example. That is, in the LLR table, the LLR value is stored for each combination of the hard bit HB2, the first soft bit SB1, and the second soft bit SB2. The LLR value is set to a value (positive value) that is larger, as the likelihood that the memory cell transistor MT stores the data of "0", is higher. The LLR value takes a smaller value (negative value), as the likelihood that the memory cell transistor MT stores the data of "1", is higher.

For example, the LLR value of the memory cell transistor MT is −9, of which the threshold voltage is included in the range of the threshold voltage designated by the index1 "1". It should be noted that, as shown in FIG. 9, when the threshold voltage of the memory cell transistor MT is provided in the range of the threshold voltage designated by the index1 "1", the hard bit HB2, the first soft bit SB1, and the second soft bit SB2 read out from the memory cell transistor MT are "1", "1", and "1", respectively. In addition, the LLR value of the memory cell transistor MT is +1, of which the threshold voltage is included in the range of the threshold voltage designated by the index1 "5". It should be noted that, as shown in FIG. 9, when the threshold voltage of the memory cell transistor MT is provided in the range of the threshold voltage designated by the index1 "5", the hard bit HB2, the first soft bit SB1, and the second soft bit SB2 read out from the memory cell transistor MT are "0", "0", and "1", respectively.

Returning to FIG. 10, the description of the correction process based on the soft bit data will be continued.

In S13, the controller 10 determines whether the soft bit correction is successful for the i1-th ECC frame. When the soft bit correction of the i1-th ECC frame is successful (S13; YES), the processing proceeds to S14. When the soft bit correction of the i1-th ECC frame fails (S13; NO), the processing proceeds to S15.

In S14, the controller 10 determines whether a HE condition is satisfied, for example, for the i1-th ECC frame based on the channel matrix 122. In the embodiment, the HE condition is satisfied when one or more memory cell transistors MT in a hard error state having a threshold voltage of less than the voltage ARt(−3) or equal to or more than the voltage ARt(+3), are present. When the HE condition is satisfied for the i1-th ECC frame (S14; YES), the processing proceeds to S16. When the HE condition is not satisfied for the i1-th ECC frame (S14; NO), the processing proceeds to S17.

In S15, the controller 10 executes the other processing excluding the soft bit correction, and executes the error correction. Then, the processing proceeds to S17. It should be noted that, in the embodiment, the processing of S15 may not be executed. At this time, when the soft bit correction of the i1-th ECC frame fails (S13; NO), the processing proceeds to S17.

In S16, the shift voltage calculation circuit 164 calculates the shift voltages dRu1 and dRu2 based on the generated channel matrix 122. Then, the shift voltage calculation circuit 164 updates the shift voltages dRu1 and dRu2 stored by the shift voltage calculation circuit 164. The update of the shift voltages dRu1 and dRu2 will be described below. Then, the processing proceeds to S17.

In S17, it is determined whether the i1-th ECC frame is the last ECC frame in the page. When the i1-th ECC frame is the last ECC frame (S17; YES), the processing is ended. When the i1-th ECC frame is not the last ECC frame (S17; NO), the processing proceeds to S18.

In S18, the controller 10 increments the variable i1 (i1++). Then, the processing proceeds to S12.

As described above, the controller 10 repeats the processing of S11 to S18 until the i1-th ECC frame is set to the last ECC frame.

As described above, the correction process based on the soft bit data is executed.

1.2.4 Generation of Channel Matrix

The generation of the channel matrix 122 will be described with reference to FIGS. 12A to 12C. FIGS. 12A to 12C are diagrams for showing generation of a channel matrix executed in the memory system according to the embodiment. FIG. 12A is a table showing the channel matrix 122. FIG. 12B is a graph showing the number of data of "0" in the channel matrix 122. FIG. 12C is a graph showing the number of data of "1" in the channel matrix 122.

In the example according to the embodiment, the size of the channel matrix 122 is 2 rows and 8 columns. The row represents the number DLECNT of data of "0" and data of "1" in the data corrected by the soft bit correction. The values N1[1] to N1[8] are the number of data of "1". The values N0[1] to N0[8] are the number of data of "0". The row represents an index1.

The value N1[1] is, for example, the number of memory cell transistors MT of which the value of the bit in the corrected data is "1" and which are included in the range of the threshold voltage designated by the index1 "1". In addition, the value N0[1] is, for example, the number of memory cell transistors MT of which the value of the bit in the corrected data is "0" and which are included in the range of the threshold voltage designated by the index1 "1".

Similarly, the value N1[5] is, for example, the number of memory cell transistors MT of which the value of the bit in the corrected data is "1" and which are included in the range of the threshold voltage designated by the index1 "5". In addition, the value N0[5] is, for example, the number of memory cell transistors MT of which the value of the bit in the corrected data is "0" and which are included in the range of the threshold voltage designated by the index1 "5".

In the channel matrix 122 shown in FIGS. 12A to 12C, the value N1[8] is the number of memory cell transistors MT in the hard error state in which the value of the bit in the corrected data is "1". In addition, the value N0[1] is the number of memory cell transistors MT in a hard error state in which the value of the bit in the corrected data is "0".

1.2.5 Calculation of Shift Voltage

The calculation of the shift voltage will be described with reference to FIGS. 13A and 13B. FIGS. 13A and 13B are diagrams for showing the calculation of the shift voltage of the soft bit read executed in the memory system according to the embodiment. FIG. 13A is a graph for showing the calculation of the shift voltage dRu1 using the number DLECNT of data of "0". In FIG. 13A, an index2, which is described later, is shown on the horizontal axis which is a linear axis, and the number DLECNT is shown on the vertical axis which is a logarithmic axis. FIG. 13B is a graph for showing the calculation of the shift voltage dRu2 using the number DLECNT of data of "1". In FIG. 13B, an index3 described later is shown on the horizontal axis which is a linear axis, and the number DLECNT is shown on the vertical axis which is a logarithmic axis.

The shift voltage calculation circuit 164 updates the shift voltage dRu based on the number DLECNT in the channel matrix 122, when the HE condition is satisfied. More specifically, the HE condition includes a first HE condition and a second HE condition. The first HE condition is satisfied when the value N0[1]≥1, i.e., when one or more memory cell transistors MT, which are set to the hard error state in which the value of the bit in the corrected data is "0", are present. In addition, the second HE condition is satisfied when the value N1[8]≥1, i.e., when one or more memory cell transistors MT, which are set to the hard error state in which the value of the bit in the corrected data is "1", are present. The shift voltage calculation circuit 164 changes the shift voltage dRu1 when the first HE condition is satisfied. In addition, when the second HE condition is satisfied, the shift voltage calculation circuit 164 changes the shift voltage dRu2.

Hereinafter, when the shift voltage dRu1 is changed and when the shift voltage dRu2 is changed will be described.

When Shift Voltage dRu1 is Changed

The shift voltage calculation circuit 164 performs fitting for the memory cell transistors MT in which the value of the bit in the corrected data is "0", based on the number DLECNT in the channel matrix 122.

More specifically, as shown in FIG. 13A, the shift voltage calculation circuit 164 performs fitting for the index2 corresponding the values N0[2] to N0[7] of the channel matrix 122, by using the values N0[2] to N0[7] of the channel matrix 122. That is, the shift voltage calculation circuit 164 performs the fitting using the data excluding the values N0[1] and N0[8]. In the example of the embodiment, the index2 is an index obtained by adding 2 to the index1 (index2=index1+2).

The fitting is executed, for example, with respect to the value N0[index2-2] for the index2 about an integer of 4 or more and 9 or less, by using a function Fit0 represented by Expression (1) below.

$$\mathrm{Fit0} = a \times e^{b \times index2} \quad (1)$$

In Expression (1), the value a and the value b are parameters of the fitting.

In the following description, a value of a function at each index is denoted by adding "[index]" to the end of the function. For example, the value of the function Fit0 in the index2 is referred to as a value Fit0 [index2].

By the above-described fitting, the shift voltage calculation circuit 164 estimates the number DLECNT corresponding to the index2 "1" to index2 "9" as the value Fit0 [index2]. In FIG. 13A, a value Fit0 [index2] estimated by the fitting is indicated by "A".

The shift voltage calculation circuit 164 adds the value Fit0 [index2] for which the index2 is 3 or less in descending order of the index2, and determines the index2max at which the total of the added values first exceeds the value N0[1]. That is, the shift voltage calculation circuit 164 determines the maximum index2max satisfying Expression (2) below, among all index2's that are equal to or less than 3.

$$\sum_{index2=index2max}^{3} \mathrm{Fit0}[\mathrm{index2}] < N0[1] \tag{2}$$

The shift voltage calculation circuit 164 calculates the shift voltage dRu1 such that the threshold voltage of the memory cell transistor MT in the hard error state is included in a range of the voltage ARt(−3) based on the index2max. Specifically, the shift voltage calculation circuit 164 calculates the shift voltage dRu1 such that the voltage ARt(−3) is lowered by a voltage ((4−index2max)×dR1) obtained by multiplying a value obtained by subtracting index2max from 4, by the shift voltage dR1 used in S8. As a result, the calculated shift voltage dRu1 is a voltage ((3×dR1+(4−index2max)×dR1)/3).

As described above, the shift voltage dRu1 is calculated.

When Shift Voltage dRu2 is Changed

The shift voltage calculation circuit 164 performs fitting for the memory cell transistors MT of which the value of the bit in the corrected data is "1", based on the number DLECNT in the channel matrix 122.

As shown in FIG. 13B, the shift voltage calculation circuit 164 performs fitting for the index3 corresponding to the values N1[2] to N1[7] of the channel matrix 122, by using the values N1[2] to N1[7] of the channel matrix 122. That is, the shift voltage calculation circuit 164 performs the fitting using the data excluding the values N1[1] and N1[8]. In the example of the embodiment, the index3 is an index obtained by subtracting the index1 from 11 (index3=11−index1).

The fitting is executed, for example, by using a function Fit1 represented by Expression (3) below, with respect to the value N1[11−index3] in which the index3 is an integer of 4 or more and 9 or less.

$$\mathrm{Fit1} = c \times e^{d \times index3} \tag{3}$$

In the above-described Expression (3), the value c and the value d are parameters of the fitting.

By the above-described fitting, the shift voltage calculation circuit 164 estimates the number DLECNT corresponding to the index3 "1" to index3 "9", as the value Fit1 [index3]. In FIG. 13B, a value Fit1[index3] estimated by the fitting is indicated by "A".

The shift voltage calculation circuit 164 adds the value Fit1[index3] for which the index3 is 3 or less in descending order of the index3, and determines the index3max in which the total of the added values first exceeds the value N1[8]. That is, the shift voltage calculation circuit 164 determines the maximum index3max satisfying Expression (4) below, among all index3's that are equal to or less than 3.

$$\sum_{index3=index3max}^{3} \mathrm{Fit1}[\mathrm{index3}] < N1[8] \tag{4}$$

The shift voltage calculation circuit 164 calculates the shift voltage dRu2 such that the threshold voltage of the memory cell transistor MT in the hard error state is included in a range equal to or higher than the voltage ARt(−3), based on the index3max. Specifically, the shift voltage calculation circuit 164 calculates the shift voltage dRu2 such that the voltage ARt(−3) is lowered by a voltage ((4−index3max)×dR2) obtained by multiplying the value obtained by subtracting the index3max from 4, by the shift voltage dR2 used in S8. As a result, the calculated shift voltage dRu2 is a voltage ((3×dR2+(4−index3max)×dR2)/3).

As described above, the shift voltage dRu2 is calculated.

Figure 14:
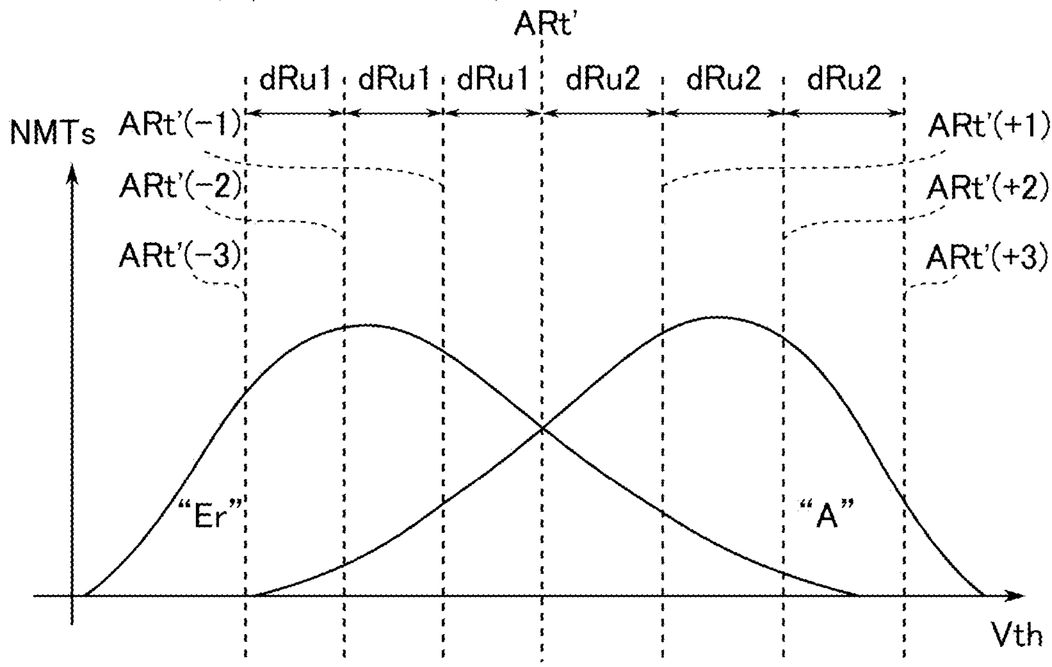
FIG. 14 is a diagram for showing the soft bit read using the calculated shift voltage executed in the memory system according to the embodiment.

As described above, by calculating the shift voltage dRu, the controller 10 uses the updated shift voltage dRu, for example, when performing the soft bit read in the next or subsequent readout operation, as shown in FIG. 14. FIG. 14 is a diagram for showing the soft bit read using the calculated shift voltage executed in the memory system according to the embodiment. FIG. 14 shows when both the shift voltages dRu1 and dRu2 are updated.

In FIG. 14, the tracking voltage ARt' is shown as the hard bit voltage of the second hard bit read in the next or subsequent readout operation. In addition, as the soft bit voltage of the soft bit read in the next or subsequent readout operation, voltages ARt'(−3), ARt'(−2), ARt'(−1), ARt'(+1), ARt'(+2), and ARt'(+3) are shown based on the tracking voltage ARt' and the shift voltages dRu1 and dRu2. The voltage ARt'(−3) has a lower voltage with respect to the voltage ARt'(−2), by the shift voltage dRu1. The voltage ARt'(−2) has a lower voltage with respect to the voltage ARt'(−1), by the shift voltage dRu1. The voltage ARt'(−1) has a lower voltage with respect to the tracking voltage ARt', by the shift voltage dRu1. The voltage ARt'(+1) has a higher voltage with respect to the tracking voltage ARt', by the shift voltage dRu2. The voltage ARt'(+2) has a higher voltage with respect to the voltage ARt'(+1), by the shift voltage dRu2. The voltage ARt'(+3) has a higher voltage with respect to the voltage ARt'(+2), by the shift voltage dRu2.

Each of the updated shift voltages dRu1 and dRu2 is higher than the shift voltages dR1 and dR2 before the update. As a result, the voltage ARt'(−3) is at a voltage lower than the voltage ARt(−3). In addition, the voltage ARt'(+3) is at a voltage higher than the voltage ARt(+3).

From the above, when the shift voltage dR is updated in the readout operation of a certain page, the updated shift voltage dRu is used in the soft bit read in the next or subsequent readout operations after the readout operation, so that the memory cell transistor MT in the hard error state is prevented from being included as shown in FIG. 14.

1.3 Effect According to Embodiment

According to the embodiment, the error correction capability of the data of the memory system 1 can be improved. Effects of the embodiment will be described below.

In the memory system 1 according to the embodiment, the controller 10 performs the soft bit correction on the plurality of memory cell transistors MT provided in a certain page, based on the second hard bit data, the first soft bit data, and the second soft bit data. In addition, the controller 10 determines the new shift voltage dRu based on the shift voltage dRu, when the HE condition is satisfied, which is based on the correction data corrected by the soft bit correction. More specifically, when the memory cell transistor MT in a hard error state having data of "0" is provided in the data corrected by the soft bit correction regarding the first page, the controller 10 calculates the shift voltage dRu1 such that the voltage ARt(−3) is lowered. In addition, when the memory cell transistor MT in the hard error state having the data of "1" is provided in the data corrected by the soft bit correction regarding the first page, the controller 10 calculates the shift voltage dRu2 such that the voltage ARt (+3) is raised. When the memory cell transistor MT in the hard error state having the data of "0" is not provided, the controller 10 maintains the shift voltage dRu1. In addition, when the memory cell transistors MT in the hard error state having the data of "1" are not provided, the controller 10 maintains the shift voltage dRu2. Then, the controller 10 uses the shift voltage dRu calculated as described above in the soft bit read in the readout operation of the second page different from the first page, after the readout operation of the first page. With the above-described configuration, it is possible to reduce the occurrence of the memory cell transistor MT that is in the hard error state during the soft bit read of the second page after the soft bit read of the first page. Therefore, the presence of the memory cell transistor MT in a hard error state reduces the failure of the soft bit correction. Therefore, the error correction ability of the data of the memory system 1 can be improved.

2. Modification Examples

Various modifications of the above-described embodiment may be made.

Hereinafter, a memory system according to a modification example will be described.

2.1 First Modification Example

In the embodiment, a case has been described, where the memory cell transistor MT in a hard error state in the HE condition is present, but the present disclosure is not limited thereto. The HE condition may be set based on at least any of the proportion or the number regarding the memory cell transistors MT in the hard error state, for each state. It should be noted that the configuration of the memory system 1 according to the first modification example is substantially the same as the configuration of the memory system according to the embodiment, and thus the description thereof will be omitted. Hereinafter, a point will be described, in which the operation of the memory system 1 according to the first modification example is different from the operation of the memory system according to the embodiment.

The HE condition in the first modification example includes the first HE condition and the second HE condition, as in the HE condition in the embodiment.

In the first modification example, the first HE condition is satisfied when, for the memory cell transistor MT in which the value of the bit in the channel matrix 122 is "0", the proportion R0HE (%) of the memory cell transistor MT in the hard error state to the fail bit number, is equal to or more than a reference proportion R0*c*0(R0HE≥R0*c*0). Here, the number of fail bits is the number of memory cell transistors MT in which the value of the bit in the channel matrix 122 is "0" and the value of which cannot be accurately determined when being read out with the tracking voltage ARt. Accordingly, the proportion R0HE is a proportion of the value N0[1] to the total of the values N0[1], N0[2], N0[3], and N0[4]. In addition, the proportion R0*c*0 is, for example, 5%.

In addition, the second HE condition is satisfied when, for the memory cell transistor MT in which the value of the bit in the channel matrix 122 is "1", the proportion R1HE (%) of the memory cell transistor MT in a hard error state to the fail bit number, is equal to or more than the reference proportion R1*c*0 (R1HE≥R1*c*0). Here, the number of fail bits is the number of memory cell transistors MT in which the value of the bit in the channel matrix 122 is "1" and the value of which cannot be accurately determined when being read out with the tracking voltage ARt. Accordingly, the proportion R1HE is a proportion of the value N1[8] to the total of the values N1[5], N1[6], N1[7], and N1[8]. In addition, the proportion R1*c*0 is, for example, 5%.

When the first HE condition is satisfied, the shift voltage calculation circuit 164 may change the shift voltage dRu1. When the second HE condition is satisfied, the shift voltage calculation circuit 164 may change the shift voltage dRu2.

In the first modification example, the first HE condition may be the condition (N0[1]≥5), instead of the condition (R0HE≥R0*c*0) for the above-described proportion R0HE. In addition, the second HE condition may be the condition (N1[8]≥5), instead of the condition (R1HE≥R1*c*0) for the above-described proportion R1HE.

Further, in the first modification example, the first HE condition may require both the condition (R0HE≥R0*c*0) for the above-described proportion R0HE and the condition (N0[1]≥5) for the number of memory cell transistors MT in the hard error state to be satisfied. In addition, the second HE condition may require both the condition (R1HE≥R1*c*0) for the above-described proportion R1HE and the condition (N1[8]≥5) for the number of memory cell transistors MT in the hard error state to be satisfied.

Since the calculation methods of the shift voltages dRu1 and dRu2 may be the same as the calculation methods of the shift voltages dRu1 and dRu2 according to the embodiment, the description thereof will be omitted.

The first modification example also exhibits the same effect as that of the embodiment.

2.2 Second Modification Example

In the embodiment and the first modification example, a case is shown in which the shift voltage dRu is calculated based on the result of the fitting of the data in the channel matrix 122, but the present disclosure is not limited thereto. For example, the shift voltage dRu may be determined according to the proportion of the memory cell transistors MT in the hard error state. Since the configuration of the memory system 1 according to the second modification example is substantially the same as the configurations of the memory system according to the embodiment and the first modification example, the description thereof will be omitted. Hereinafter, a point will be mainly described, in which the operation of the memory system 1 according to the second modification example is different from the operation of the memory system according to the embodiment and the operation of the memory system according to the first modification example.

In the second modification example, when the first HE condition is satisfied, in the processing of S16, the shift voltage calculation circuit 164 calculates the shift voltage dRu1 according to the proportion R0HE of the memory cell transistors MT in the hard error state in which the value of the bit in the channel matrix 122 is "0".

More specifically, the shift voltage calculation circuit 164 calculates the shift voltage dRu1 based on, for example, the proportion R0HE and the proportions R0_c_1 and R0_c_2 (percent) of the plurality of references. When the proportion R0HE is less than the proportion R0_c_1, the shift voltage calculation circuit 164 calculates the shift voltage dRu1 such that the voltage ARt(−3) is lowered by, for example, the shift voltage dR1 used in S8. That is, the calculated shift voltage dRu1 is a voltage (4×dR1/3). In addition, when the proportion R0HE is equal to or greater than the proportion R0_c_1 and less than the proportion R0_c_2, the shift voltage calculation circuit 164 calculates the shift voltage dRu1 such that the voltage ARt(−3) is lowered by a voltage (2×dR1) obtained by multiplying the shift voltage dR1 used in S8, by 2. That is, the calculated shift voltage dRu1 is a voltage (5×dR1/3). In addition, when the proportion R0HE is equal to or more than the proportion R0_c_2, the shift voltage calculation circuit 164 calculates the shift voltage dRu1 such that the voltage ARt(−3) is lowered by a voltage (3×dR1) obtained by multiplying the shift voltage dR1 used in S8, by 3. That is, the calculated shift voltage dRu1 is a voltage (2×dR1). Each of the proportions R0_c_1 and R0_c_2 is, for example, 10% and 20%. In addition, the proportion of the reference for calculating the shift voltage dRu1 may be one or three or more.

In addition, when the second HE condition is satisfied, in the processing of S16, the shift voltage calculation circuit 164 calculates the shift voltage dRu2 according to the proportion R1HE of the memory cell transistors MT in the hard error state in which the value of the bit in the channel matrix 122 is "1".

More specifically, the shift voltage calculation circuit 164 calculates the shift voltage dRu2 based on, for example, the proportion R1HE and the proportions R1_c_1 and R1_c_2 (percent) of the plurality of references. When the proportion R1HE is less than the proportion R1_c_1, the shift voltage calculation circuit 164 calculates the shift voltage dRu2 such that the voltage ARt(+3) is increased, for example, by the shift voltage dR2 used in S8. That is, the calculated shift voltage dRu2 is a voltage (4×dR2/3). In addition, when the proportion R1HE is equal to or more than the proportion R1_c_1 and less than the proportion R1_c_2, the shift voltage calculation circuit 164 calculates the shift voltage dRu2 such that the voltage ARt(+3) is increased by a voltage (2×dR2) obtained by multiplying the shift voltage dR2 used in S8, by 2. That is, the calculated shift voltage dRu2 is a voltage (5×dR2/3). In addition, when the proportion R1HE is equal to or more than the proportion R1_c_2, the shift voltage calculation circuit 164 calculates the shift voltage dRu2 such that the voltage ARt(+3) is increased by a voltage (3×dR2) obtained by multiplying the shift voltage dR2 used in S8, by 3. That is, the calculated shift voltage dRu2 is the voltage (2×dR2). Each of the proportions R1_c_1 and R1_c_2 is, for example, 10% and 20%. In addition, the proportion of the reference for calculating the shift voltage dRu2 may be one or three or more.

Even by the second modification example, the same effects as those of the embodiment and the first modification example can be obtained.

2.3 Third Modification Example

In the embodiment, the first modification example, and the second modification example, a case has been shown in which the shift voltage dRu is calculated when the soft bit correction is successful, but the present disclosure is not limited thereto. Even when the soft bit correction fails, the controller 10 may calculate the shift voltage dRu based on the channel matrix 122 when the soft bit correction fails. Since the configuration of the memory system 1 according to the third modification example is substantially the same as the configurations of the memory systems according to the embodiment, the first modification example, and the second modification example, the description thereof will be omitted. Hereinafter, a point will be mainly described, in which the operation of the memory system 1 according to the third modification example is different from the operation of the memory systems according to the embodiment, the first modification example, and the second modification example.

Figure 15:
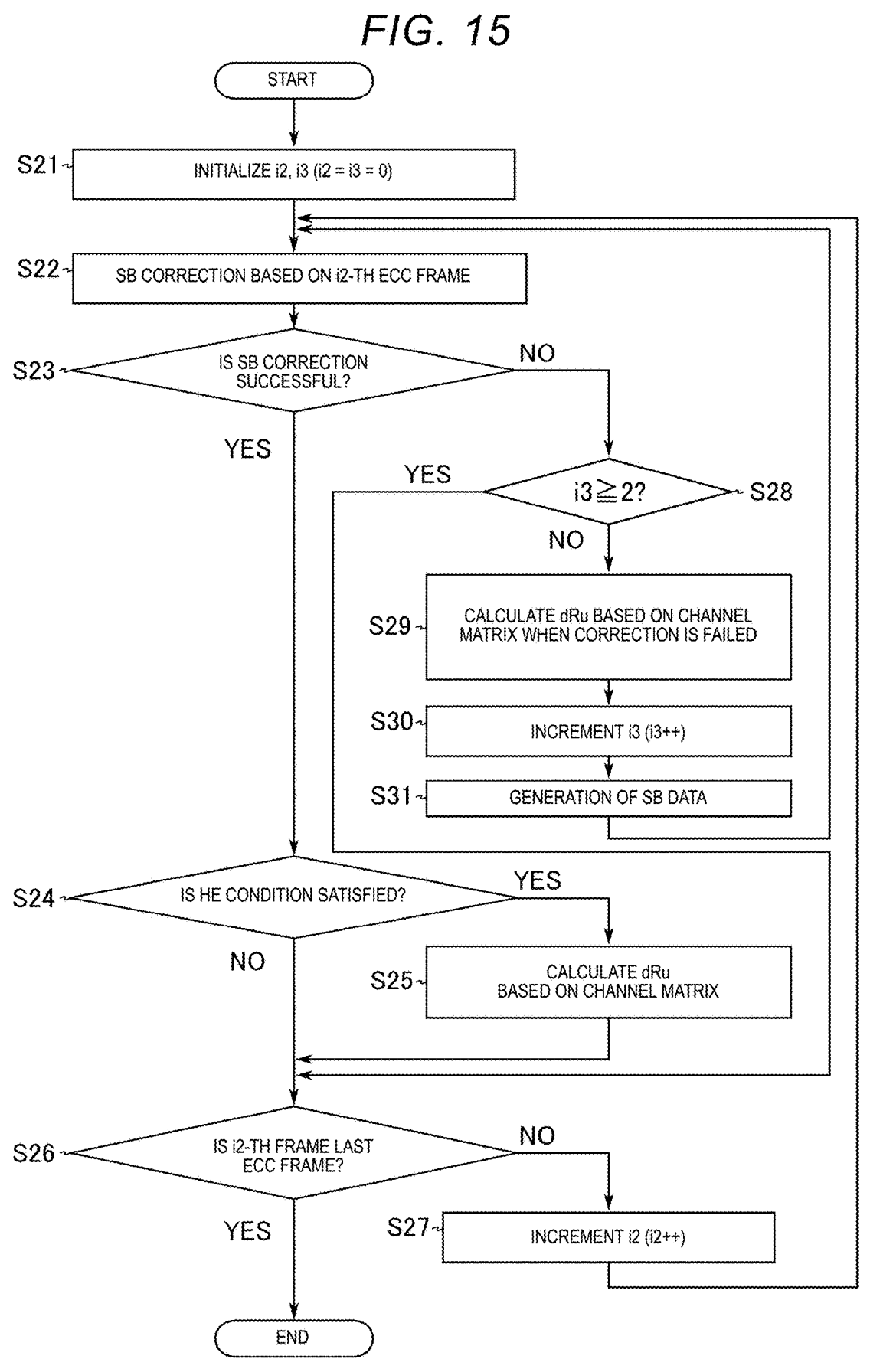

A readout operation of the memory system 1 according to the third modification example will be described with reference to FIG. 15. FIG. 15 is a flowchart for showing a flow of a correction process based on soft bit data of the memory system according to the third modification example. Since the overall flow of the readout operation in the third modification example may be the same as the overall flow of the readout operation according to the embodiment, the description thereof will be omitted.

In S21, the variables i2 and i3 are initialized (i2=i3=0). Then, the processing proceeds to S22. The processing of S22 and S24 to S27 may be the same as the processing of S11, S12, S14, and S16 to S18, except that a variable i2 is used instead of the variable i1.

In S23, the controller 10 determines whether the soft bit correction is successful for the i2-th ECC frame. When the soft bit correction of the i2-th ECC frame is successful (S23; YES), the processing proceeds to S24. When the soft bit correction of the i2-th ECC frame fails (S23; NO), the processing proceeds to S28.

In S28, the controller 10 determines whether the variable i3 is equal to or greater than a preset value. In the example of FIG. 15, a case is shown in which the preset value is 2, but the present disclosure is not limited thereto, and the above-described preset value may be an integer of 1 or 3 or more. When the variable i3 is equal to or greater than the preset value (S28; YES), the processing proceeds to S26. When the variable i3 is less than the preset value (S28; NO), the processing proceeds to S29. By the processing of S28, the number of times of executing the processing of S29 described below, is set to a value equal to or less than a preset value.

In S29, the controller 10 calculates the shift voltages dRu1 and dRu2 based on, for example, the channel matrix when the soft bit correction fails. The soft bit correction fails, for example, when a large number of memory cell transistors MT in a hard error state are provided. The shift voltages dRu1 and dRu2 may be calculated in the same manner as the calculation of the shift voltages dRu1 and dRu2 in the embodiment, the first modification example, and the second modification example. Then, the processing proceeds to S30.

In S30, the controller 10 increments the variable i3 (i3++). Then, the processing proceeds to S31.

In S31, the controller 10 performs the same processing as the processing of S8 by using the shift voltage dRu calculated in S29. It should be noted that, in S31, the second hard bit data may be, for example, the same as the second hard bit data in the processing of S8. Then, the processing proceeds to S22.

As described above, in S26, the controller 10 repeats the processing of S22 to S31 until the i2-th ECC frame is set to the last ECC frame.

As described above, the correction process based on the soft bit data in the third modification example is executed.

It should be noted that, in the third modification example, when the soft bit correction fails in S23, the generation of the soft bit data may be executed a plurality of times in the readout operation for the same page.

The third modification example also provides the same effects as those of the embodiment, the first modification example, and the second modification example.

3. Others

In the above-described embodiment, the first modification example, the second modification example, and the third modification example, a case is shown in which the second hard bit data and the soft bit data are acquired by the second hard bit read and the soft bit read in the processing of S8. Meanwhile, the first modification example is not limited thereto. The second hard bit data and the soft bit data may be generated based on a result of the threshold voltage tracking of S4, instead of executing the second hard bit read and the soft bit read. It should be noted that, in the threshold voltage tracking, the controller 10 executes a readout process using a plurality of readout voltages. The plurality of readout voltages are set, for example, around a threshold voltage (central voltage) estimated to be close to the intersection between the "Er" state and the "A" state. Then, the controller 10 calculates the tracking voltage ARt by using the above-described readout results. In the above-described threshold voltage tracking, the number of readout voltages used in the threshold voltage tracking is larger than the number of readout voltages used to acquire the second hard bit data and the soft bit data. As a result, in the other examples, the controller 10 may generate the second hard bit data and the soft bit data by using the readout result by the readout voltage closest to each of the voltages ARt(−3), ARt(−2), ARt(−1), ARt(+1), ARt(+2), and ARt(+3) and the tracking voltage ARt, among the plurality of readout voltages used for the threshold voltage tracking.

In addition, in the above-described embodiment, the first modification example, the second modification example, and the third modification example, a case has been described, in which the threshold voltage distribution includes two states, but the present disclosure is not limited thereto. In the memory system 1, the threshold voltage distribution may include four, eight, and more states, for example, by the threshold voltage of the plurality of memory cell transistors MT. At this time, for example, the shift voltage calculation circuit 164 may calculate the shift voltage dRdef based on the result of the threshold voltage tracking. More specifically, the shift voltage dRdef may be determined based on a difference in the threshold voltage between the adjacent states or the like. It should be noted that the calculation of the shift voltage dRdef may be executed in the processing of S6.

While certain embodiments have been described, these embodiments have been presented by way of example only, and are not intended to limit the scope of the disclosure. Indeed, the novel embodiments described herein may be embodied in a variety of other forms; furthermore, various omissions, substitutions and changes in the form of the embodiments described herein may be made without departing from the spirit of the disclosure. The accompanying claims and their equivalents are intended to cover such forms or modifications as would fall within the scope and spirit of the disclosure.

What is claimed is:

1. A memory system comprising:

a semiconductor memory including a plurality of first memory cells each configured to store data in a non-volatile manner according to a threshold voltage; and a controller that stores a first shift voltage, wherein the controller is configured to:

perform a first error correction process for the plurality of first memory cells, based on first hard bit data and first soft bit data acquired using a plurality of first soft bit voltages that have been calculated based on the first shift voltage, and generate a channel matrix that indicates, for each of a plurality of threshold voltage ranges, a number of first memory cells determined to store a first value and a number of first memory cells determined to store a second value, determine whether a hard error condition is satisfied based on a number of first memory cells indicated by the generated channel matrix to be in a hard error state, wherein a first memory cell is in the hard error state when a threshold voltage of the first memory cell is lower than a lowest voltage among the plurality of first soft bit voltages or higher than a highest voltage among the plurality of first soft bit voltages, and when the hard error condition is satisfied, calculate a second shift voltage based on the channel matrix and update the first shift voltage stored in the controller with the second shift voltage for use in a next execution of the first error correction process.

2. The memory system according to claim 1, wherein the semiconductor memory further includes a plurality of second memory cells each configured to store data in a non-volatile manner according to a threshold voltage, and the controller is configured to perform a second error correction process for the plurality of second memory cells, based on second hard bit data and second soft bit data acquired using a plurality of second soft bit voltages that have been calculated based on the second shift voltage.

3. The memory system according to claim 2, wherein the first hard bit data is acquired using a first hard bit voltage that is greater than a first voltage having a lowest voltage among the plurality of first soft bit voltages and less than a second voltage having a highest voltage among the plurality of first soft bit voltages.

4. The memory system according to claim 3, wherein the second hard bit data is acquired using a second hard bit voltage that is different from the first hard bit voltage.

5. The memory system according to claim 1, wherein the controller calculates the second shift voltage and updates the first shift voltage when the first error correction process completes successfully.

6. The memory system according to claim 5, wherein the controller calculates, based on a result of the first error correction process, a first quantity of first memory cells determined to store the first value and having a threshold voltage that is lower than the lowest voltage among the plurality of first soft bit voltages, and the hard error condition is satisfied if the first quantity is one or more.

7. The memory system according to claim 3, wherein the controller calculates, based on a result of the first error correction process, a first quantity of first memory cells determined to store the second value and having a threshold voltage that is higher than the highest voltage among the plurality of first soft bit voltages, and the hard error condition is satisfied if the first quantity is one or more.

8. A memory system comprising:

a semiconductor memory including a plurality of first memory cells each configured to store data in a non-volatile manner according to a threshold voltage; and a controller that stores a first shift voltage and a second shift voltage, wherein the controller is configured to:

perform a first error correction process for the plurality of first memory cells, based on first hard bit data that is acquired using a first hard bit voltage and first soft bit data acquired using a plurality of first soft bit voltages that are less than the first hard bit voltage, which have been calculated based on the first shift voltage, and a plurality of second soft bit voltages that are greater than the first hard bit voltage, which have been calculated based on the second shift voltage, and generate a channel matrix that indicates, for each of a plurality of threshold voltage ranges, a number of first memory cells determined to store a first value and a number of first memory cells determined to store a second value, determine whether each of a first hard error condition and a second hard error condition is satisfied based on a number of first memory cells indicated by the generated channel matrix to be in a hard error state, wherein a first memory cell is in the hard error state when a threshold voltage of the first memory cell is less than a lowest voltage among the plurality of first soft bit voltages or higher than a highest voltage among the plurality of second soft bit voltages, and when the first hard error condition is satisfied, correct the first shift voltage, and when the second hard error condition is satisfied, correct the second shift voltage, for use in a next execution of the first error correction process.

9. The memory system according to claim 8, wherein each of the first soft bit voltages is less than the first hard bit voltage by an integer multiple of the first shift voltage, and each of the second soft bit voltages is greater than the first hard bit voltage by an integer multiple of the second shift voltage.

10. The memory system according to claim 9, wherein the corrected first shift voltage is larger than the first shift voltage, and the corrected second shift voltage is larger than the second shift voltage.

11. The memory system according to claim 9, wherein the controller is configured to correct the first shift voltage and the second shift voltage, when the first error correction process completes successfully.

12. The memory system according to claim 11, wherein the controller calculates, based on a result of the first error correction process, a first quantity of first memory cells determined to store the first value and having a threshold voltage that is lower than the lowest voltage among the plurality of first soft bit voltages, a second quantity of first memory cells determined to store the second value and having a threshold voltage that is higher than the highest voltage among the plurality of second soft bit voltages, and the first hard error condition is satisfied when the first quantity is one or more, and the second hard error condition is satisfied when the second quantity is one or more.

13. The memory system according to claim 12, wherein the first hard error condition is satisfied when the first quantity is equal to or more than a first reference quantity, and the second hard error condition is satisfied when the second quantity is equal to or more than a second reference quantity.

14. The memory system according to claim 13, wherein the controller corrects the first shift voltage based on a quantity of first memory cells determined to store the first value in each of a plurality of threshold voltage ranges that are defined by the first soft bit voltages, the first hard bit voltage, and the second soft bit voltages between the lowest voltage among the plurality of first soft bit voltages and the highest voltage among the plurality of second soft bit voltages, and the controller corrects the second shift voltage based on a quantity of first memory cells determined to store the second value in each of the plurality of threshold voltage ranges.

15. The memory system according to claim 14, wherein the controller corrects the first shift voltage such that a quantity of first memory cells determined to store the first value and having a threshold voltage that is less than a lowest of a plurality of third soft bit voltages that are calculated using the corrected first shift voltage is zero, and the controller corrects the second shift voltage such that a quantity of first memory cells determined to store the second value and having a threshold voltage that is greater than a highest of a plurality of fourth soft bit voltages that are calculated using the corrected second shift voltage is zero.

16. The memory system according to claim 11, wherein the controller calculates, based on a result of the first error correction process, a first quantity of first memory cells determined to store the first value and having a threshold voltage that is lower than the lowest voltage among the plurality of first soft bit voltages, a second quantity of first memory cells determined to store the second value and having a threshold voltage that is higher than the highest voltage among the plurality of second soft bit voltages, and the first hard error condition is satisfied when a first proportion for the first quantity is equal to or greater than a first reference proportion, and the second hard error condition is satisfied when a second proportion for the second quantity is equal to or greater than a second reference proportion.

17. The memory system according to claim 16, wherein the first proportion is a proportion of the first quantity to a quantity of first memory cells determined to store the first value and having a threshold voltage that is lower than the first hard bit voltage, and the second proportion is a proportion of the second quantity to a quantity of first memory cells determined to store the second value and having a threshold voltage that is equal to or higher than the first hard bit voltage.

18. The memory system according to claim 17, wherein the controller corrects the first shift voltage according to a magnitude of the first proportion, and the controller corrects the second shift voltage according to a magnitude of the second proportion.

19. The memory system according to claim 11, wherein the controller is configured to calculate at least one of a third shift voltage that is different from the first shift voltage and the corrected first shift voltage, and a fourth shift voltage that is different from the second shift voltage and the corrected second shift voltage, when the first error correction process does not complete successfully, and the controller is configured to perform a second error correction process for the plurality of first memory cells, based on second hard bit data that is acquired using a second hard bit voltage that is different from the first hard bit voltage and second soft bit data acquired using a plurality of third soft bit voltages, which have been calculated based on at least one of the third shift voltage and the fourth shift voltage.

20. The memory system according to claim 8, wherein the semiconductor memory further includes a first word line connected to the plurality of first memory cells, and a plurality of second memory cells each configured to store data in a non-volatile manner according to a threshold voltage and connected to the first word line together with the plurality of first memory cells, and the first hard bit data and the first soft bit data each include data for the first memory cells and data for the second memory cells.

* * * * *